United States Patent
Choi

(10) Patent No.: US 9,853,047 B2
(45) Date of Patent: Dec. 26, 2017

(54) SEMICONDUCTOR DEVICE AND METHOD OF MANUFACTURING THE SAME

(71) Applicant: SK hynix Inc., Gyeonggi-do (KR)

(72) Inventor: Kang Sik Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/177,897

(22) Filed: Jun. 9, 2016

(65) Prior Publication Data

US 2017/0213843 A1 Jul. 27, 2017

(30) Foreign Application Priority Data

Jan. 26, 2016 (KR) .................. 10-2016-0009320
Apr. 25, 2016 (KR) .................. 10-2016-0050189

(51) Int. Cl.

| H01L 27/115 | (2017.01) |
|---|---|
| H01L 27/11582 | (2017.01) |
| H01L 27/11526 | (2017.01) |
| H01L 27/11556 | (2017.01) |
| H01L 27/11573 | (2017.01) |
| H01L 29/423 | (2006.01) |

(52) U.S. Cl.
CPC .. *H01L 27/11582* (2013.01); *H01L 27/11526* (2013.01); *H01L 27/11556* (2013.01); *H01L 27/11573* (2013.01); *H01L 29/4232* (2013.01)

(58) Field of Classification Search
CPC ......... H01L 27/11582; H01L 27/11526; H01L 27/11556; H01L 27/11573; H01L 29/4232
See application file for complete search history.

(56) References Cited

U.S. PATENT DOCUMENTS

| 8,237,218 | B2 | 8/2012 | Murata et al. | |
|---|---|---|---|---|
| 2011/0115010 | A1* | 5/2011 | Shim | H01L 27/11565 257/314 |
| 2012/0168824 | A1* | 7/2012 | Lee | H01L 27/11582 257/204 |
| 2015/0145015 | A1* | 5/2015 | Shin | H01L 27/11556 257/314 |
| 2015/0179662 | A1* | 6/2015 | Makala | H01L 27/11582 257/314 |
| 2015/0194441 | A1* | 7/2015 | Yatsuda | H01L 27/11582 438/587 |
| 2015/0255481 | A1* | 9/2015 | Baenninger | H01L 27/11582 438/268 |
| 2015/0255485 | A1* | 9/2015 | Kameoka | H01L 27/11582 257/314 |
| 2015/0279857 | A1* | 10/2015 | Kim | H01L 27/11582 438/269 |
| 2016/0155750 | A1* | 6/2016 | Yasuda | H01L 27/11582 257/324 |

FOREIGN PATENT DOCUMENTS

KR     1020150067811     6/2015

* cited by examiner

*Primary Examiner* — Nathan W Ha
(74) *Attorney, Agent, or Firm* — IP & T Group LLP

(57) ABSTRACT

There is provided a semiconductor device. The semiconductor device includes a source layer, a well pickup layer formed on the source layer, a body structure formed on the well pickup layer and including a well region contacting the well pickup layer and first junctions formed on side walls of the body structure, channel pillars contacting the body structure and protruding from the body structure, and contact layers formed on the side walls of the body structure and electrically connecting the body structure and the well pickup layer.

20 Claims, 25 Drawing Sheets

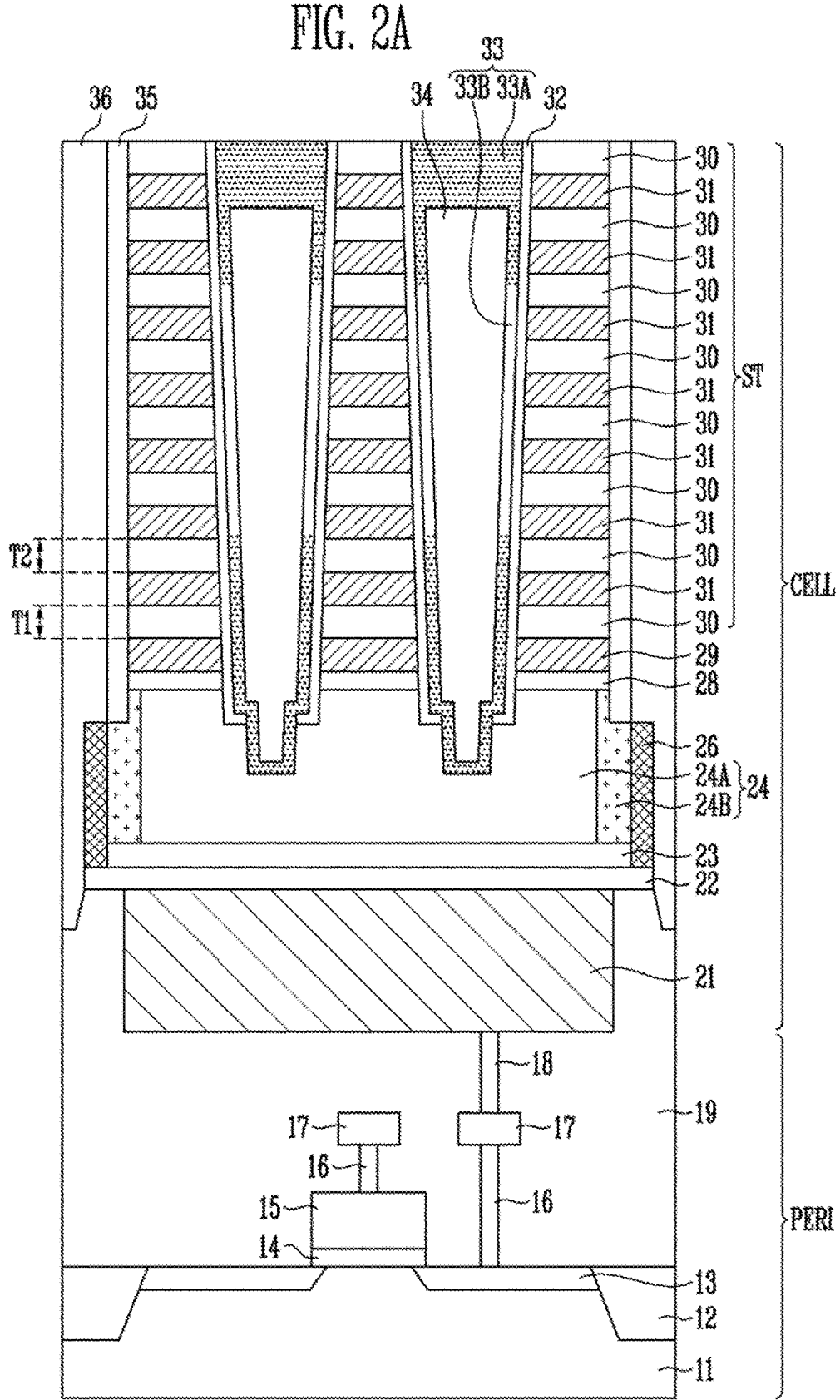

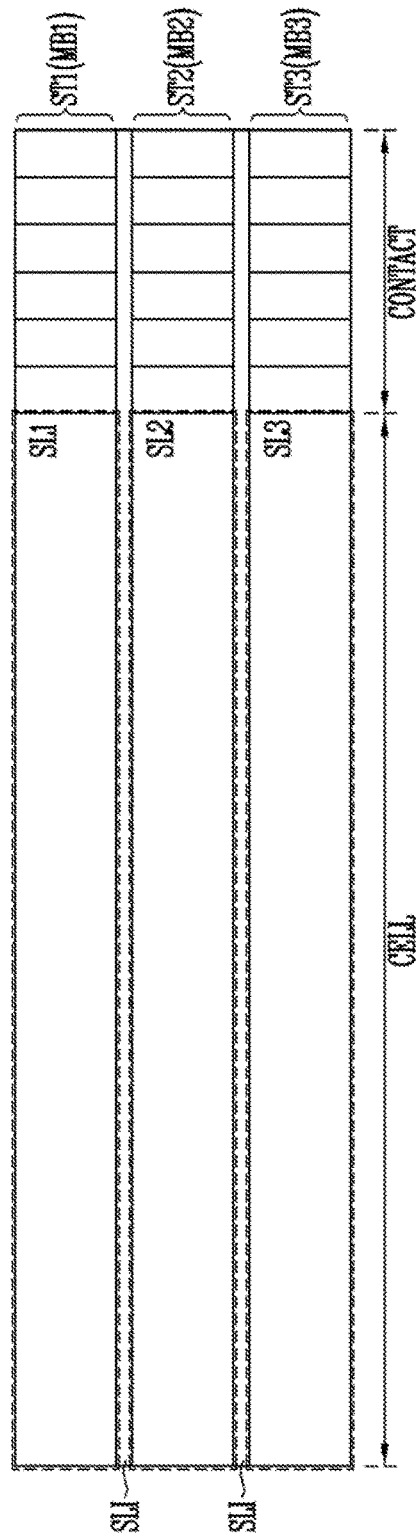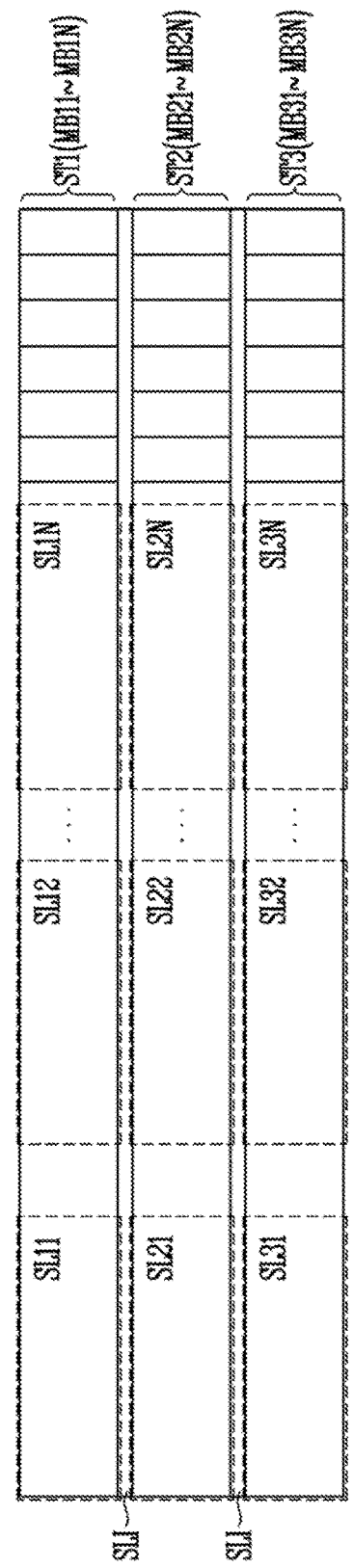

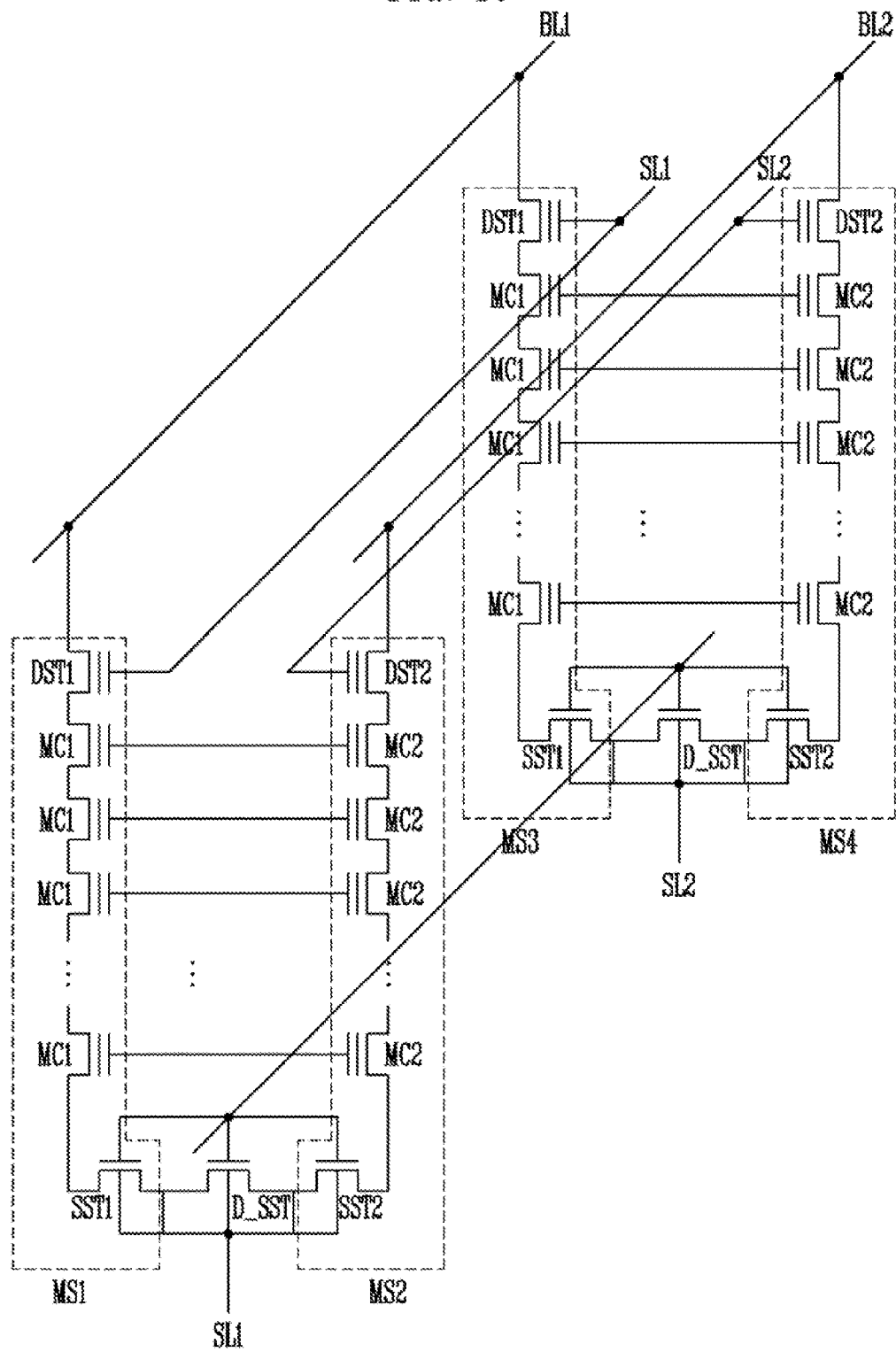

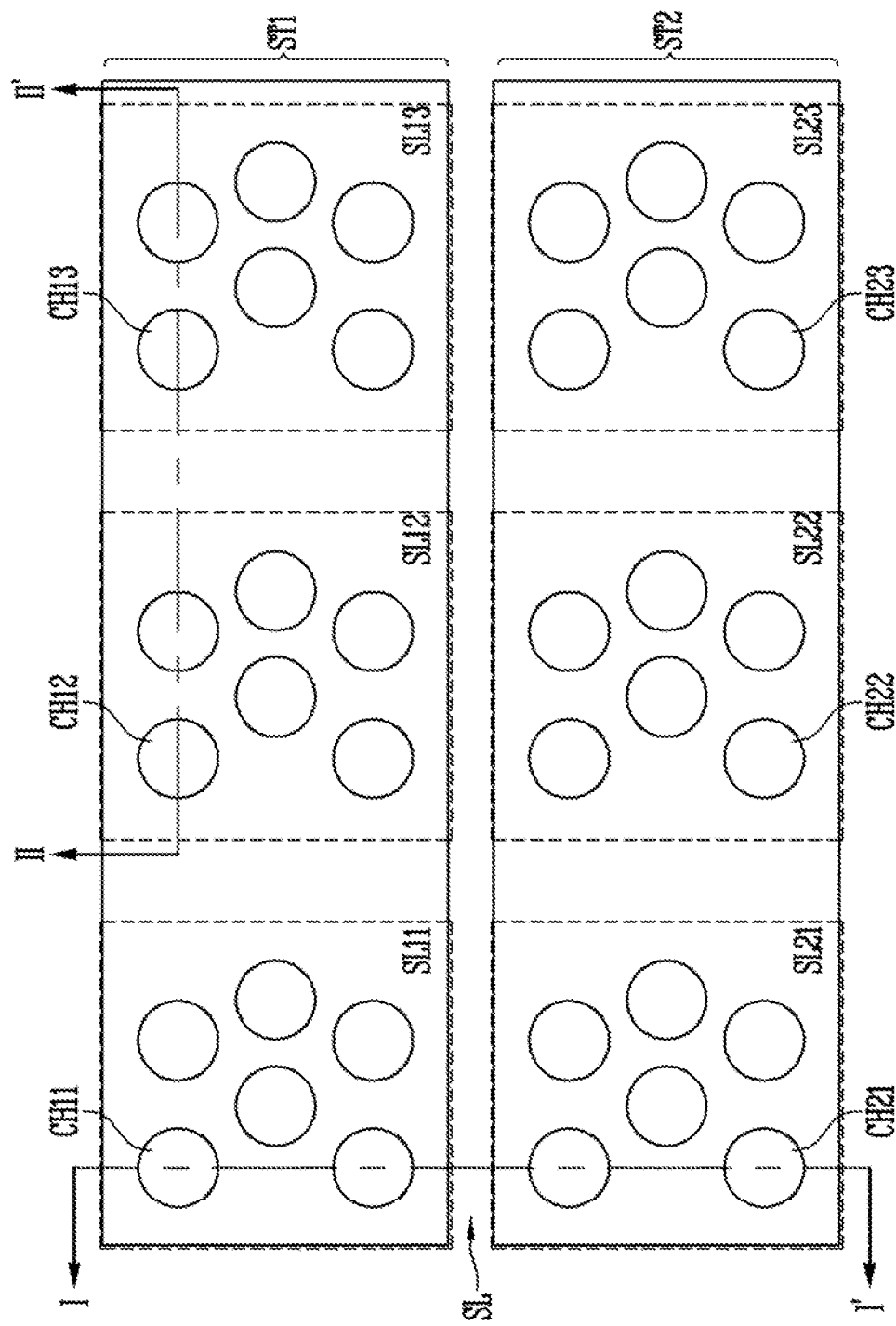

I-I'

II-II'

I-I'

II-II'

I-I'

II-II'

I-I'

II-II'

I-I'

II-II'

SEMICONDUCTOR DEVICE AND METHOD OF MANUFACTURING THE SAME

CROSS-REFERENCE TO RELATED APPLICATION

The present application claims a priority under 35 U.S.C. 119(a) to Korean patent application number 10-2016-0009320 filed on Jan. 26, 2016, and 10-2016-0050189 filed on Apr. 25, 2016, which are incorporated herein by reference in their entirety.

BACKGROUND

1. Field

Embodiments of the present invention relate generally to an electronic device and, more particularly, to a three dimensional semiconductor memory device and a method of manufacturing the same.

2. Description of the Related Art

In a non-volatile memory device, stored data is maintained even when power supply to the device is cut off. Recently, as further improvements in the integration degree of a two dimensional memory device are limited, a three dimensional non-volatile memory device has been proposed. Unlike a two dimensional memory device in which memory cells are formed in a single layer, in a three dimensional non-volatile memory device memory cells are vertically stacked on a substrate of a silicon material forming a plurality of layers.

More specifically, in a three dimensional non-volatile memory device, a source select transistor, memory cells, and a drain select transistor may be vertically stacked. The three dimensional non-volatile memory device may perform an erase operation by supplying holes to a vertical channel layer. However, it is difficult to supply a sufficient amount of holes during the erase operation. In addition, when holes are generated performance of the source select transistor may deteriorate due to gate induced drain leakage (GIDL).

SUMMARY

An embodiment of the present invention relates to a semiconductor device with improved erasing characteristic and integration degree and a method of manufacturing the same.

A semiconductor device according to an embodiment of the present invention includes a source layer, a well pickup layer formed on the source layer, a body structure formed on the well pickup layer and including a well region contacting the well pickup layer and first junctions formed on side walls of the body structure, channel pillars contacting the body structure and protruding from the body structure, and contact layers formed on the side walls of the body structure and electrically connecting the body structure and the well pickup layer.

A semiconductor device according to an embodiment of the present invention includes a source layer, a well pickup layer formed on the source layer, a body structure formed on the well pickup layer and including a well region contacting the well pickup layer and first junctions formed on side walls of the body structure, a stacked structure formed on the body structure, channel pillars passing through the stacked structure and contacting the body structure, and contact layers formed on the side walls of the body structure and electrically connecting the first junctions and the well pickup layer.

A method of manufacturing a semiconductor device according to an embodiment of the present invention includes forming a source layer, forming a well pickup layer on the source layer, forming a body structure on the well pickup layer, forming a gate insulating layer on a top surface of the body structure, forming a first material layer for a source select line on the gate insulating layer, forming first junctions on side walls of the body structure, and forming contact layers on the side walls of the body structure, wherein the contact layers are configured to electrically connect the body structure and the well pickup layer.

It is possible to electrically connect a well pickup layer and a source layer through contact layers formed on side walls of a body structure. Therefore, it is possible to improve an erase operation by directly supplying electronic holes from the source layer to a channel pillar during the erase operation. In addition, it is possible to increase an integration degree of a memory device by positioning a peripheral region under a cell region.

BRIEF DESCRIPTION OF THE DRAWINGS

Example embodiments of the present invention will now be described more fully hereinafter with reference to the accompanying drawings; however, it is noted that the invention may be embodied in different forms and should not be construed as being limited to the embodiments set forth herein. Rather, these embodiments are provided so that this disclosure will be thorough and complete, and will fully convey the scope of the invention to those skilled in the art to which this invention pertains.

In the drawings, dimensions may be exaggerated for clarity of Illustration. Also, it will be understood that when an element is referred to as being "between" two elements, it can be the only element between the two elements, or one or more intervening elements may also be present. Like reference numerals refer to like elements throughout.

FIGS. 2A to 2C are side, cross-sectional views illustrating a structure and an operation principle of a semiconductor device, according to another embodiment of the present invention;

FIGS. 3A to 3C are layout diagrams of a stacked layer and a source layer, according to an embodiment of the present invention;

FIGS. 4B and 4C are circuit diagrams of a cell array, according to an embodiment of the present invention;

FIGS. 5, 6A to 15A, 6B to 15B, and 9C are schematic views illustrating a method of manufacturing a semiconductor device, according to an embodiment of the present invention;

DETAILED DESCRIPTION

Figure 1A:
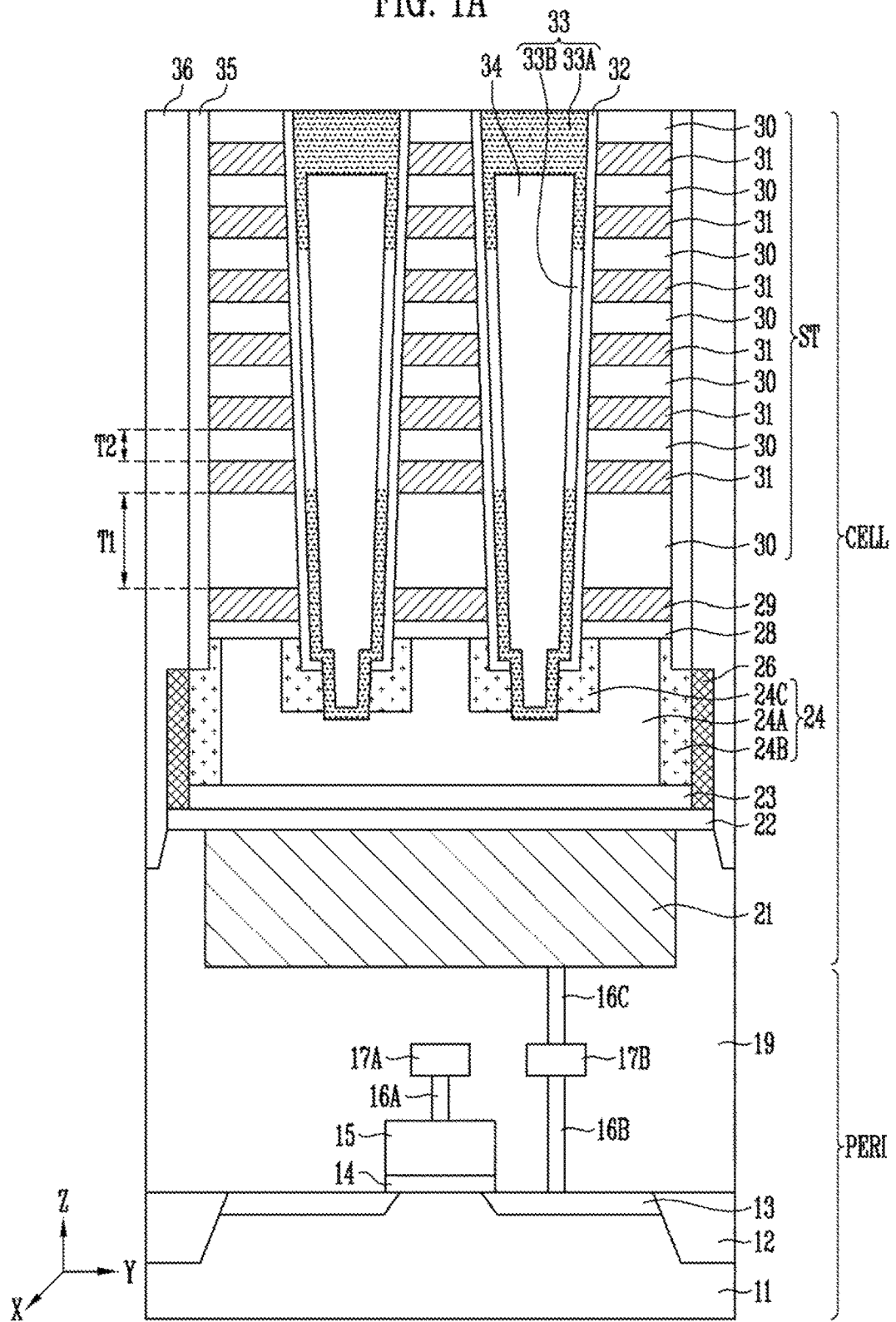
FIGS. 1A to 1C are side, cross-sectional views illustrating a structure and an operation principle of a semiconductor device, according to an embodiment of the present invention.

Example embodiments will now be described more fully hereinafter with reference to the accompanying drawings. In the drawing figures, dimensions may be exaggerated for clarity of illustration. Well-known configurations that are not related to the gist of the present invention may be omitted. Like reference numerals refer to like elements throughout.

Figure 1B:
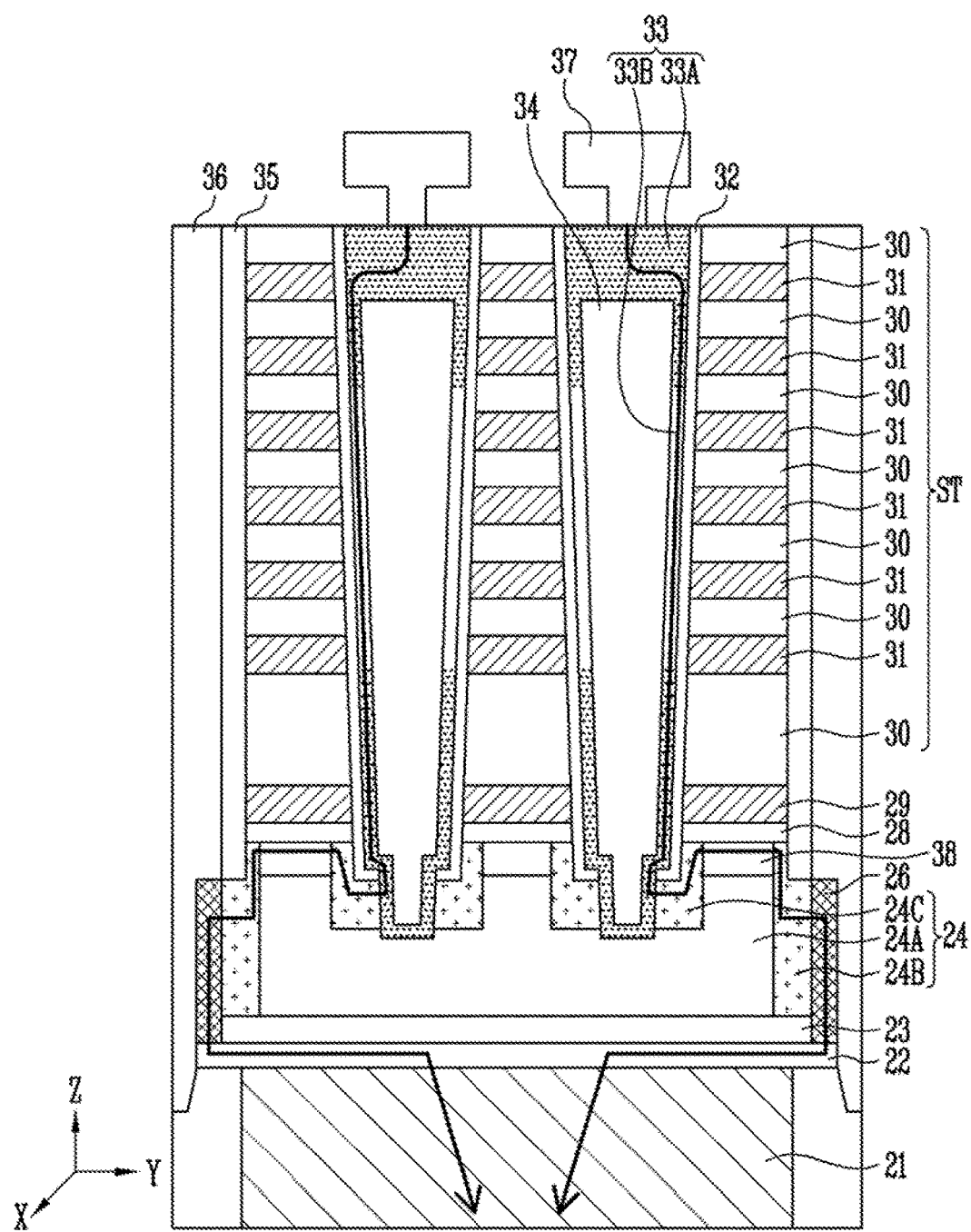
Figure 1C:
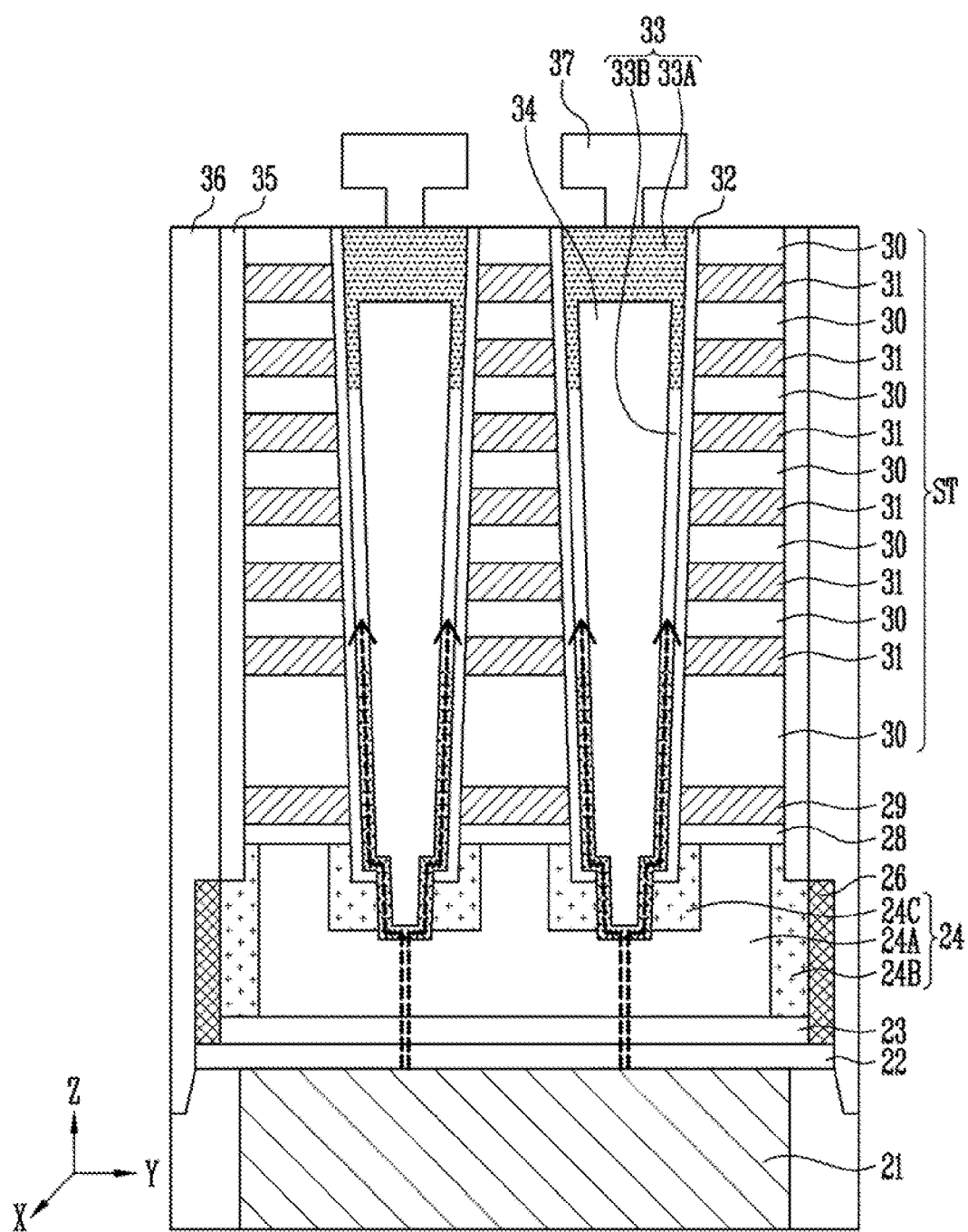

FIGS. 1A to 1C are cross-sectional views illustrating a structure and an operation principle of a semiconductor device, according to an embodiment of the present invention.

Referring to FIG. 1A, the semiconductor device according to the embodiment of the present invention includes a cell region CELL and a peripheral region PERI positioned under the cell region CELL. A cell array including stacked memory cells is positioned in the cell region CELL and a circuit for driving the cell array is positioned in the peripheral region PERI.

In the cell region CELL, a well pickup layer 23 is positioned on a source layer 21, a body structure 24 is positioned on the well pickup layer 23, and contact layers 26 are positioned along the side walls of the body structure 24.

The source layer 21 may include a metal, such as, for example, tungsten (W). The well pickup layer 23 may include a semiconductor material such as, polysilicon, silicon germanium (SiGe), and the like doped with p-type impurities of high concentration. A barrier layer 22 is interposed between the source layer 21 and the well pickup layer 23. The barrier layer 22 may be a metal layer including, for example, titanium (Ti), tantalum (Ta), titanium nitride (TiN), and tantalum nitride (TaN).

The body structure 24 includes a well region 24A that contacts the well pickup layer 23 and first junctions 24B formed on the side walls thereof. The body structure 24 may be made of a polysilicon layer. The well region 24A, and the first junctions 24B may include impurities. For example, the well region 24A may include first type impurities whereas the first junctions 24B may include second type impurities different from the first type impurities. In an embodiment, the well region 24A may be doped with p-type impurities of low concentration whereas the first junctions 24B may be doped with n-type impurities of low concentration. In another embodiment, the well region 24A may not be doped with impurities whereas the first junctions 24B may be doped with n-type impurities of high concentration.

The contact layers 26 may be silicide layers. The contact layers 26 may be formed, for example, by siliciding the side walls of the body structure 24. Any suitable process may be used. In addition, the contact layers 26 directly contact the first junctions 24B, the well pickup layer 23, and the barrier layer 22. Therefore, the contact layers 26 electrically connect the body structure 24 and the well pickup layer 23. For example, the contact layers 26 electrically connect the first junctions 24B and the well pickup layer 23.

At least one source select transistor is formed on the body structure 24 and the source select transistor includes a gate insulating layer 28 formed on a top surface of the body structure 24 and a gate electrode 29 formed on the gate insulating layer 28. In addition, the first junctions 24B formed on the side walls of the body structure 24 may be source regions of the source select transistor.

The gate electrode 29 of the source select transistor extends in a first direction (X-direction). The gate electrodes 29 of the source select transistors arranged in the first direction may be electrically connected to each other by a source select line. Therefore, reference numeral 29 may also denote the source select line. The gate insulating layer 28 may be obtained by oxidizing the top surface of the body structure 24 to a partial thickness. Therefore, the source select transistor may have a planar structure extending in the X and Y plane.

A stacked structure ST is positioned on the source select transistor. The stacked structure ST includes alternately stacked conductive layers 31 and insulating layers 30. Here, at least the uppermost conductive layer 31 may be a gate electrode of a drain select transistor while the remaining conductive layers 31 may be gate electrodes of memory cells. That is, the at least uppermost conductive layer 31 is a drain select line DSL and the remaining conductive layers 31 may be word lines WL. The insulating layers 30 insulate the stacked gate electrodes from each other. The lowermost insulating layer 30 has a larger thickness T1 than the thickness T2 of the remaining insulating layers 30 (T1>T2).

Insulating spacers 35 may be formed along the side walls of the stacked structure ST. In addition, a slit insulating layer 36 may be positioned between adjacent stacked structures ST, between adjacent source layers 21, or between adjacent body structures 24. The insulating spacers 35 and the slit insulating layers 36 are layers extending in a third direction (Z-direction) and the first direction (X-direction).

Two channel pillars 33 contact the body structure 24 and protrude inward the body structure 24. Although, two channel pillars are shown in the embodiment of FIG. 1, the invention is not limited in this way. For example, in other embodiments, three or more channel pillars may be spaced apart in a Y-direction in the area walled in between two consecutive insulating spacers 35. The body structure 24 also includes second junctions 24C positioned in parts that contact the channel pillars 33. Each second junction 24C may include n-type impurities of high concentration to form a drain region of the source select transistor. In addition, the channel pillars 33 may pass through the second junctions 24C and contact the well region 24A under the second junctions 24C.

The channel pillars 33 protrude from the top surface of the body structure 24 and pass through the stacked structure ST. Therefore, a plurality of memory cells and at least one drain select transistor are stacked along the channel pillars 33. The memory cells and the drain select transistor have gate all around (GAA) structures in which gate electrodes surround side walls of the channel pillars 33 at 360 degrees.

Each of the channel pillars 33 includes a gap fill insulating layer 34, a junction 33A, and a channel region 33B. The junction 33A may include a higher concentration of impurities than the channel region 33B and may be a drain region of the drain select transistor. The uppermost surface of the gap fill insulating layer 34 is substantially at the same level (in the Z direction) as the lower side of the uppermost conductive layer 31. The junction 33A is formed above the uppermost surface of the gap fill insulating layer 34 and extends in the Z-direction up to the level of the upper surface of the uppermost insulating layer 30. The junction 33A is also formed around the sides of an uppermost part of the gap fill insulating layer 34 filling an upper part of the channel region 33B. Hence, the junction 33A has sufficient depth so that it overlaps (in the Z and Y directions) the uppermost conductive layer 31 which forms the gate electrode of the drain select transistor.

Memory layers 32 may surround side walls of the channel pillars 33, respectively. Each of the memory layers 32 may include at least one of a charge blocking layer, a data storage layer, and a tunnel insulating layer; and the data storage layer may include silicon, a nitride, a phase change material, a ferroelectric material, or a nano dot.

In addition, in the embodiment of FIG. 1A, each of the channel pillars 33 includes impurities in a lower part of the channel region 33B including that part of the channel region 33B, which is contacting each of the second junctions 24C. For example, the impurities included in the second junctions 24C may be diffused into the channel pillars 33 during the manufacturing process so that junctions may be formed under the channel pillars 33. However, in another embodiment the channel pillars 33 may not include impurities. The channel pillars 33 may include an undoped semiconductor layer.

In the embodiment of FIG. 1A, two channel pillars 33 are shown spaced apart at a first regular interval along a second direction (Y-direction) in the area defined between two consecutive insulating spacers 35. Although not shown, a plurality of channel pillars 33 may be spaced apart at a second regular interval extending along the first direction (X-direction), thus forming two rows of channel pillars within the walled in area between two consecutive insulating spacers 35.

The peripheral region PERI may include a transistor and a register as will be described in detail below. An active region is defined by a device isolation layer 12 formed in a substrate 11, and a transistor including a gate insulating layer 14 and a gate electrode 15 is positioned on the active region. Junctions 13 are formed in the substrate 11 on both sides of the gate electrode 15. A first wiring line 17a is connected to the gate electrode 15 via a first contact plug 16a. A second wiring line 17b is connected to the junction 13 via a second contact plug 16b. In addition, the second wiring line 17b is also directly connected to the source layer 21 of the cell region CELL through a third contact plug 16c that passes through an interlayer insulating layer 19.

In the above-described structure, the body structure 24, the well pickup layer 23 and the barrier layer 22 are electrically connected through the contact layer 26 so that the well pickup layer 23 and the source layer 21 are also electrically connected. In addition, by positioning the peripheral region PERI under the cell region CELL, the integration degree of the memory device may be increased.

FIGS. 1B and 1C are views illustrating an operation principle of a semiconductor device according to an embodiment of the present invention. A read operation and an erase operation of a semiconductor device will be described with reference to FIGS. 1B and 1C. FIG. 1B is a cross-sectional view illustrating a current path during a read operation. FIG. 1C is a cross-sectional view illustrating a current path during an erase operation.

Referring to FIG. 1B, during a read operation, a selected bit line 37 is precharged, and an operation voltage Vcc is applied to the gate electrode 29 of the source select transistor and the gate electrode of the drain select transistor so that the gate electrode 29 of the source select transistor and the gate electrode of the drain select transistor are turned on. In addition, a read voltage Vread is applied to a gate electrode of a selected memory cell and a pass voltage Vpass is applied to gate electrodes of non-selected memory cells. The read voltage Vread has a level at which a memory cell transistor MC is turned on or turned off in accordance with data written in the memory cell transistor MC. The pass voltage Vpass has a level at which the memory cell transistor MC is turned on regardless of the data written in the memory cell transistor MC.

In such a case, the source select transistor is turned on, and a channel 38 is formed between the first junctions 24B and the second junctions 24C and between the adjacent second junctions 24C between the two consecutive channel pillars 33. Moreover, via the contact layers 26 and the barrier layer 22 the current path extends to the source layer 21. Hence, current paths are formed between the source layer 21 and the channel pillars 33. Therefore, when the selected memory cell MC is turned on, currents flow to the source layer 21 through the channel pillars 33, the second junctions 24C, the channel 38, the first junctions 24B, the contact layers 26, and the barrier layer 22.

The source select transistor may be turned off during a program operation.

Referring to FIG. 1C, during an erase operation, the erase voltage Vers is applied to the selected well pickup layer 23. In such a case, forward bias is applied to a PN diode structure formed in the p-type well pickup layer 23, the p-type or undoped well region 24A, and the n-type channel pillars 33. Therefore, electronic holes may be directly supplied from the source layer 21 to the channel pillars 33.

In the above-described operation, the source layer 21 and the well pickup layer 23 are shorted by the contact layers 26 so that the current paths running through the channel pillars 33 and the source layer 21 may be formed when the source select transistor is turned on. In addition, since the electronic holes are directly supplied from the source layer 21 to the channel pillars 33 during an erase operation, a sufficient amount of electronic holes may be supplied without causing GIDL. Therefore, it is possible to prevent the source select transistors SST of the semiconductor device from deteriorating.

Figure 2B:
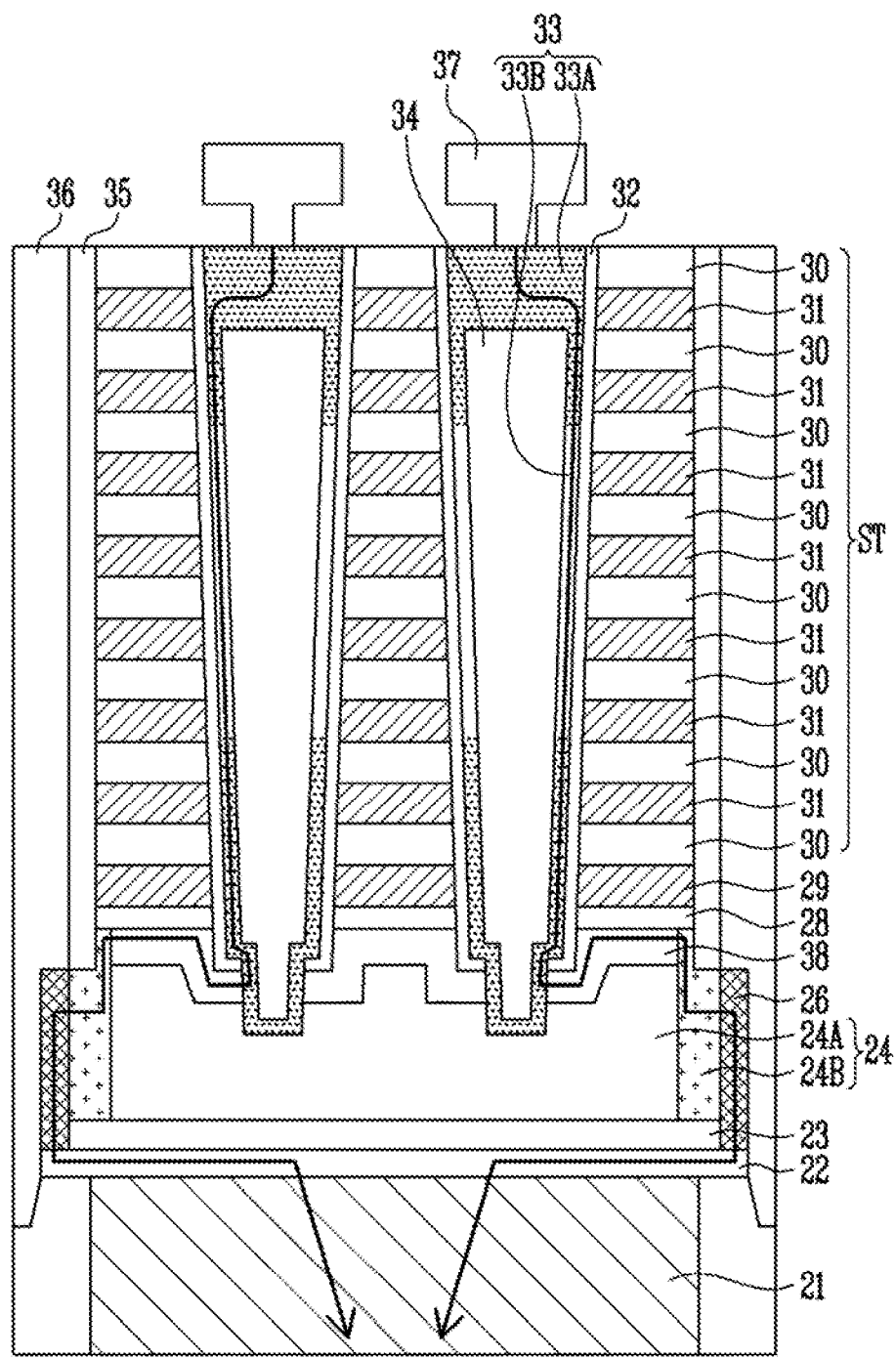
Figure 2C:
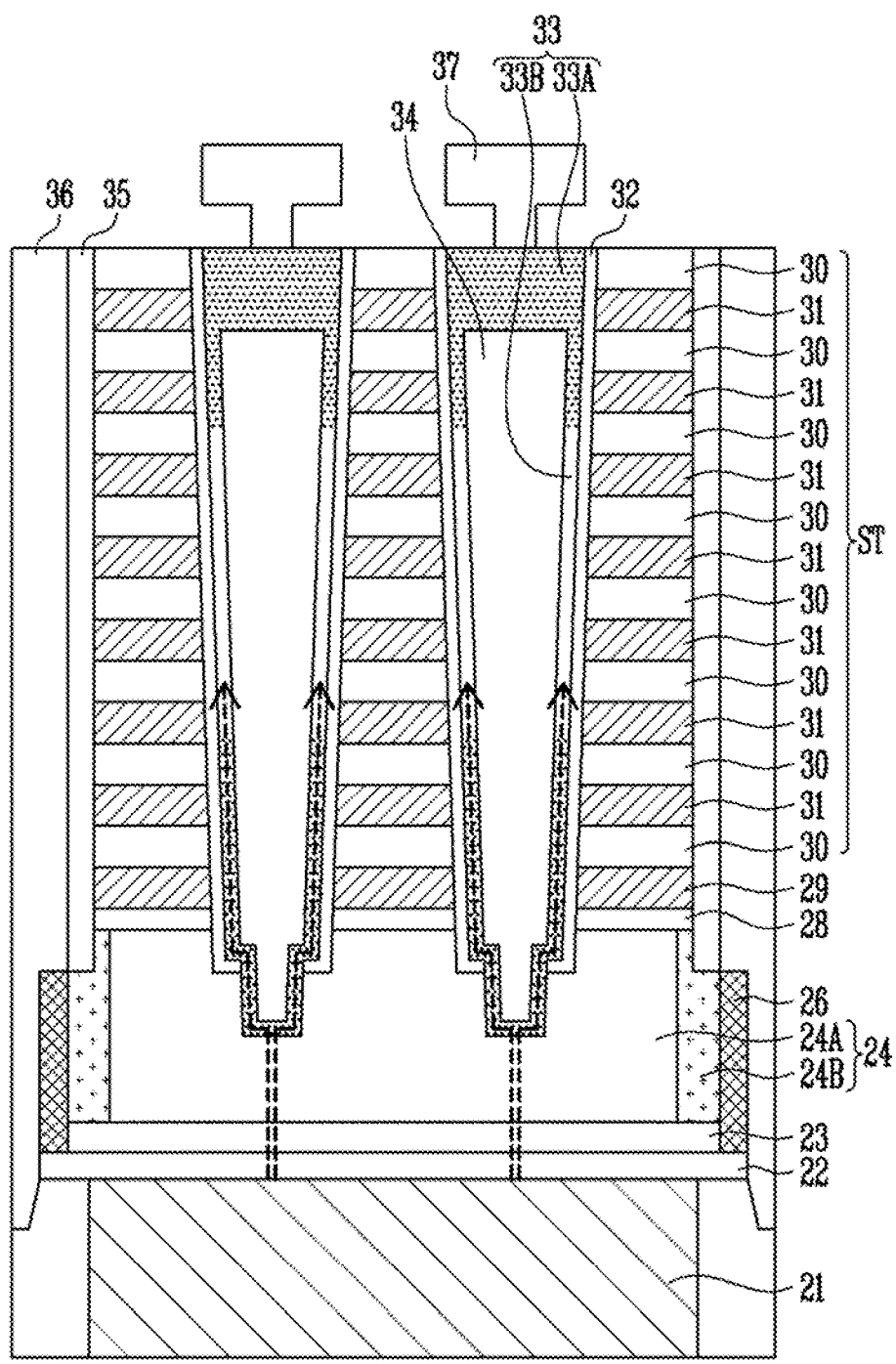

FIGS. 2A to 2C are cross-sectional views illustrating a structure and an operation principle of a semiconductor device according to an embodiment of the present invention. Hereinafter, description of contents repeated to the above-described contents will not be given.

Referring to FIG. 2A, the body structure 24 includes the well region 24A and the first junctions 24B and does not include the second junctions 24C in regions that contact the channel pillars 33. Therefore, the channel pillars 33 contact the well region 24A. In addition, the lowermost insulating layer 30 has the same thickness as the remaining insulating layers 30 (T1=T2). The remaining structure is the same as described with reference to FIG. 1A.

Referring to FIG. 2B, during a read operation, the operation voltage Vcc is applied to the source select transistor SST so that the source select transistor SST is turned on. Therefore, the channel 38 is formed between the first junctions 24B formed on both side walls of the body structure 24, that is, on the top surface of the body structure 24. Referring to FIG. 2C, during an erase operation, the holes are directly implanted from the source layer 21 to the pillar channels 33 by applying the erase voltage Vers to the well pickup layer 23.

According to the current embodiment, since the body structure 24 does not include the second junctions 24C, when the source select transistor is turned on, an amount of current may be smaller than that in the embodiment of FIG. 1B. Instead, although the erase voltage Vers at a lower level than that in the embodiment of FIG. 1C is applied during the erase operation, the electronic holes may be easily supplied. For example, the erase voltage Vers may be lower than that in the embodiment of FIG. 1C by about 0.5V.

Figure 3C:
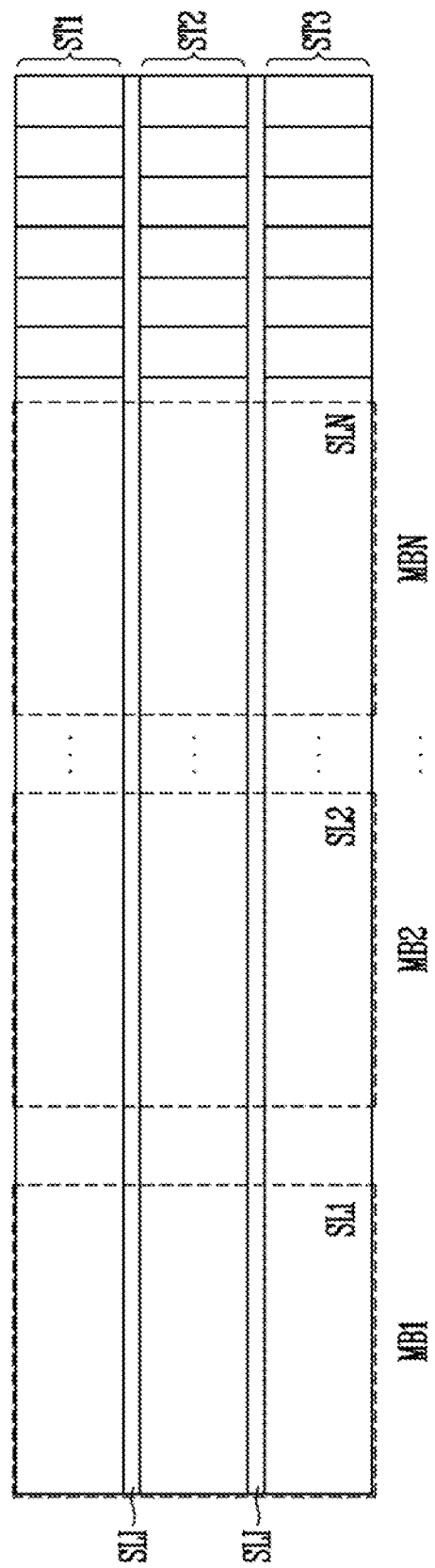

FIGS. 3A to 3C are layout diagrams of a stacked layer and a source layer according to an embodiment of the present invention.

Referring to FIG. 3A, stacked structures ST1 to ST3 respectively include cell regions CELL and contact regions CONTACT. In the contact regions CONT, pad units of a source select line, word lines, and drain select lines are exposed in order to respectively drive stacked source select transistor, memory cells, and drain select transistor. For example, a contact region of the stacked structure ST may be in the form of steps. For reference, although not shown, the peripheral region PERI may be positioned only under the cell region CELL or may be positioned under the cell region CELL and the contact region CONTACT.

In addition, a semiconductor device includes the plurality of stacked structures ST1 to ST3, and slit insulating layers SLI may be positioned among the adjacent stacked structures ST1 to ST3. The slit insulating layers SLI are formed to have depths with which the slit insulating layers SLI pass through the stacked structures ST1 to ST3 and source layers SL1 to SL3. That is, the adjacent stacked structures ST1 to ST3 and the adjacent source layers SL1 to SL3 are insulated from each other by the slit insulating layers SU.

The stacked structures ST1 to ST3 may respectively correspond to memory blocks MB1 to MB3. The memory blocks MB1 to MB3 are units by which the erase operation is performed. The erase operation is performed on memory cells included in the respective memory blocks MB1 to MB3. According to the current embodiment, one of the source layers SL1 to SL3 is positioned under one of the stacked structures ST1 to ST3. Therefore, the stacked structures ST1 to ST3 are driven as the memory blocks MB1 to MB3, respectively.

Referring to FIG. 3B, a plurality of source layers SL11 to SL1N are positioned under the stacked structure ST1. In addition, the plurality of source layers SL11 to SL1N positioned under the stacked structure ST1 are insulated from each other. Therefore, during the erase operation, the plurality of source layers SL11 to SL1N are separately driven and may supply the electronic holes, and the single stacked structure ST1 may be driven by a plurality of memory blocks MB11 to MB1N.

Referring to FIG. 3C, the plurality of source layers SL11 to SL1N are positioned under the single stacked structure ST1, and the plurality of source layers SL11 to SL1N positioned under the single stacked structure ST1 are insulated from each other. In addition, the source layers SL1 to SL3 positioned under the adjacent stacked structures ST1 to ST3 are connected to each other. That is, the adjacent stacked structures ST1 to ST3 share the source layers SL1 to SL3.

For example, the first to third source layers SL1 to SL3 positioned under the first stacked structure ST1 are insulated from each other. In addition, since the first source layer SL1 is positioned under the first to third stacked structures ST1 to ST3, the first to third stacked structures ST1 to ST3 share the first source layer SL1. In such a case, among the first to third stacked structures ST1 to ST3, memory strings connected to the first source layer SL1 are driven as the first memory block MB1.

Figure 4A:
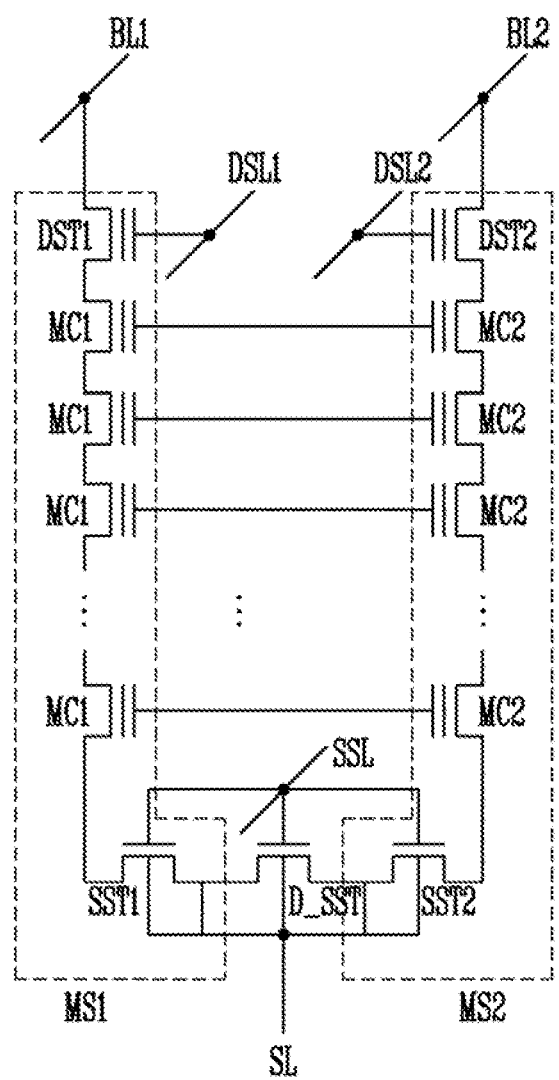
FIG. 4A is a circuit diagram of a memory string, according to an embodiment of the present invention.

FIG. 4A is a circuit diagram of a memory string according to an embodiment of the present invention.

Referring to FIG. 4A, a first memory string MS1 includes at least one first source select transistor SST1, a plurality of memory cells MC, and at least one first drain select transistor DST1 that are serially connected to each other. A second memory string MS2 includes at least one second source select transistor SST2, a plurality of memory cells MC, and at least one second drain select transistor DST2 that are serially connected to each other. The first memory string MS1 is connected to a first bit line BL1 and a second memory string MS2 is connected to a second bit line BL2. In addition, a first drain select transistor DST1 is connected to a first drain select line DSL1 and a second drain select transistor DST2 is connected to a second drain select line DST2.

A dummy source select transistor D_SST is connected to drain ends of the first and second source select transistors SST1 and SST2. The first and second source select transistors SST1 and SST2 and the dummy source select transistor D_SST are connected to one source select line SSL. In addition, the first and second source select transistors SST1 and SST2 and the dummy source select transistor D_SST may share the body structure 24. The first memory string MS1 and the second memory string MS2 share a source line SL.

According to the embodiment of the present invention, the contact layers 26 may electrically connect the body structure 24 and the well pickup layer 23 (refer to FIG. 1A). Thus, a back bias may be applied to the first and second source select transistors SST1 and SST2 and the dummy source select transistors D_SST. In addition, source terminals of the first and second source select transistors SST1 and SST2 may be coupled to the well pickup. Thus, a voltage of the source line SL may be applied as the back bias to the first and second source select transistors SST1 and SST2. However, another voltage different from the voltage of the source line may be applied as the back bias.

Figure 4B:
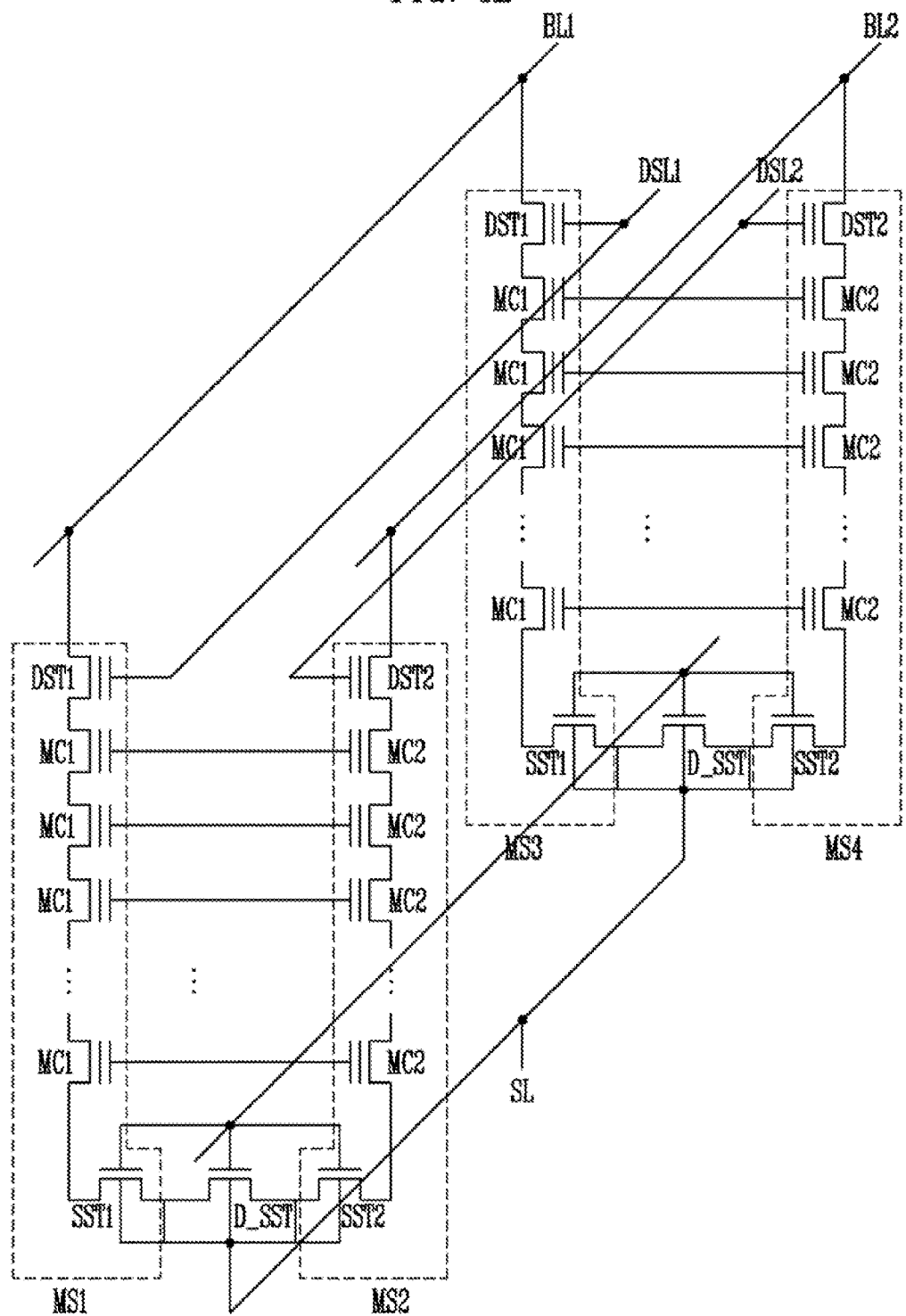

FIG. 4B is a circuit diagram of a cell array according to an embodiment of the present invention, in which one source layer is positioned under one stacked structure. Referring to FIG. 4B, memory strings MS1 to MS4 included in one stacked structure are commonly connected to one source layer SL. Therefore, the memory strings MS1 to MS4 included in one stacked structure are driven by one memory block.

FIG. 4C is a circuit diagram of a cell array according to an embodiment of the present invention, in which a plurality of source layers are positioned under one stacked structure. Referring to FIG. 4C, the memory strings MS1 to MS4 included in one stacked structure are connected to a plurality of source layers SL1 and SL2. For example, the first and second memory strings MS1 and MS2 are commonly connected to the first source layer SL1 and the third and fourth memory strings MS3 and MS4 are commonly connected to the second source layer SL2.

Therefore, the memory strings MS1 to MS4 included in one stacked structure are driven by a plurality of memory blocks. For example, the first and second memory strings MS1 and MS2 are driven by one memory block and the third and fourth memory strings MS3 and MS4 are driven by one memory block.

FIGS. 5, 6A to 15A, 6B to 15B, and 9C are views illustrating a method of manufacturing a semiconductor device according to an embodiment of the present invention. FIG. 5 is a layout. FIGS. 6A to 15A are cross-sectional views taken along a first direction (the line I-I') of FIG. 5 and FIGS. 6B to 15B are cross-sectional views taken along a second direction (the line II-II') of FIG. 5.

Referring to FIG. 5, a semiconductor device, according to an embodiment of the present invention, includes a plurality of stacked structures ST1 and ST2. A slit SL is positioned between the adjacent stacked structures ST1 and ST2. The slit SL may be filled with a slit insulating layer.

A plurality of source layers may be positioned under the respective stacked structures ST1 and ST2. For example, first to third source layers SL11 to SL13 are positioned under the first stacked structure ST1, and first to third source layers SL21 to SL23 are positioned under the second stacked structure ST2.

In addition, a plurality of channel pillars CH11 to CH13 and CH21 to CH23 pass through the stacked structures ST1 and ST2, and are connected to the source layers SL11 to SL13 and SL21 to SL23. For example, among the first to third channel pillars CH11 to CH13 that pass through the first stacked structure ST1, the first channel pillars CH11 are connected to the first source layer SL11, the second channel pillars CH12 are connected to the second source layer SL12, and the third channel pillars CH13 are connected to the third source layer SL13. In addition, among the first to third channel pillars CH21 to CH23 that pass through the second stacked structure ST2, the first channel pillars CH21 are connected to the first source layer SL21, the second channel pillars CH22 are connected to the second source layer SL22, and the third channel pillars CH23 are connected to the third source layer SL23.

For reference, as described with reference to FIGS. 3A to 3C, one source layer is positioned under one stacked structure or adjacent stacked structures may share one source layer.

Figure 6A:
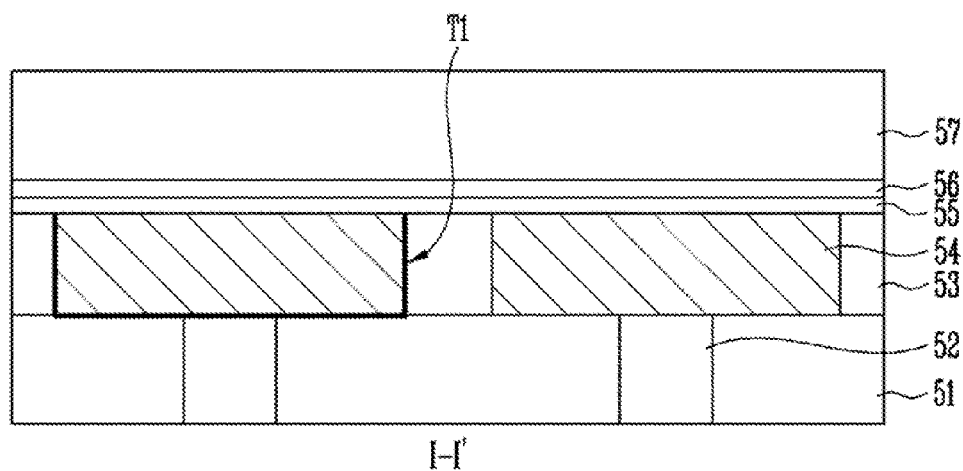
Figure 6B:
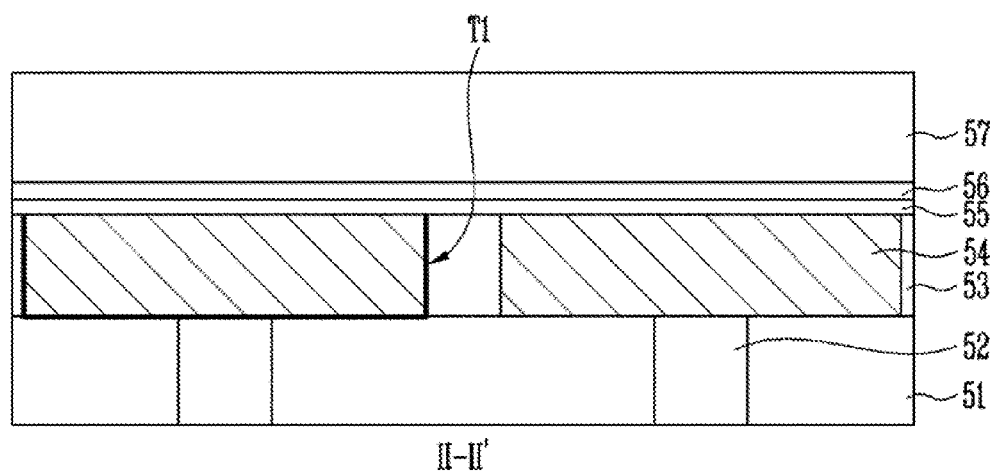

Referring to FIGS. 6A and 6B, a first insulating layer 51 and contact plugs 52 that pass through the first insulating layer 51 are formed on a resultant material in which an understructure (not shown) such as a peripheral circuit is formed. For example, the contact plugs 52 may be an interconnection structure for electrically connecting the peripheral circuit and source layers 54.

Then, after forming a second insulating layer 53, a plurality of trenches T1 are formed in the second insulating layer 53. The first trenches T1 for forming the source layers 54 are in the form of Islands separated by a predetermined distance. By the first trenches T1, a position of one source layer or positions of a plurality of source layers positioned under one stacked structure may be defined. The first trenches T1 may be formed to a depth with which the contact plugs 52 are exposed. Then, the source layers 54 which are electrically connected to the contact plugs 52 are formed in the first trenches T1. For example, one source layer 54 may be connected to one contact plug 52. In addition, the source layers 54 may include a metal, such as, for example, tungsten (W).

Then, a barrier layer 55, a well pickup layer 56, and a body structure 57 are sequentially formed on the second insulating layer 53 in which the source layers 54 are formed. The barrier layer 55 may be a metal layer including, for example, titanium (Ti), tantalum (Ta), titanium nitride (TiN), and tantalum nitride (TaN). The well pickup layer 56 may be a conductive layer including first type impurities of high concentration, for example, a polysilicon layer including p-type impurities. In addition, the body structure 57 may be a semiconductor layer that includes first type impurities of low concentration or that does not include impurities. For example, the body structure 57 may be an undoped polysilicon layer or a polysilicon layer including p-type impurities.

Figure 7A:
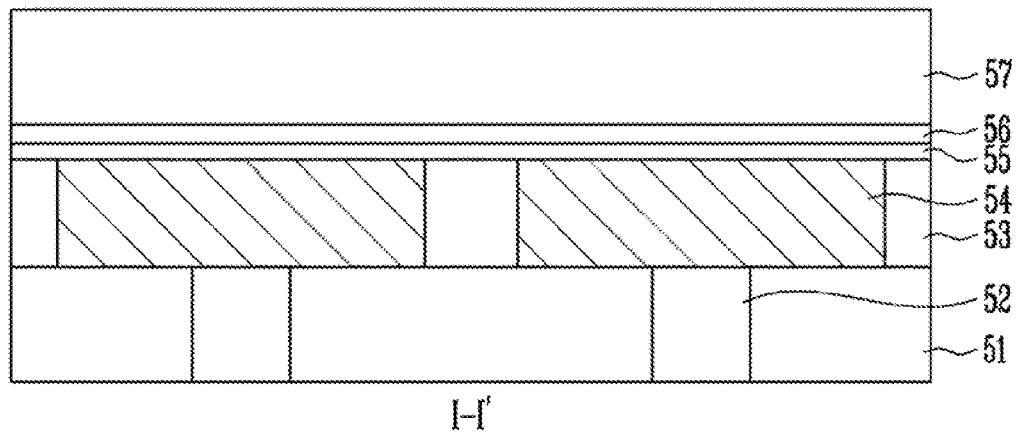
Figure 7B:
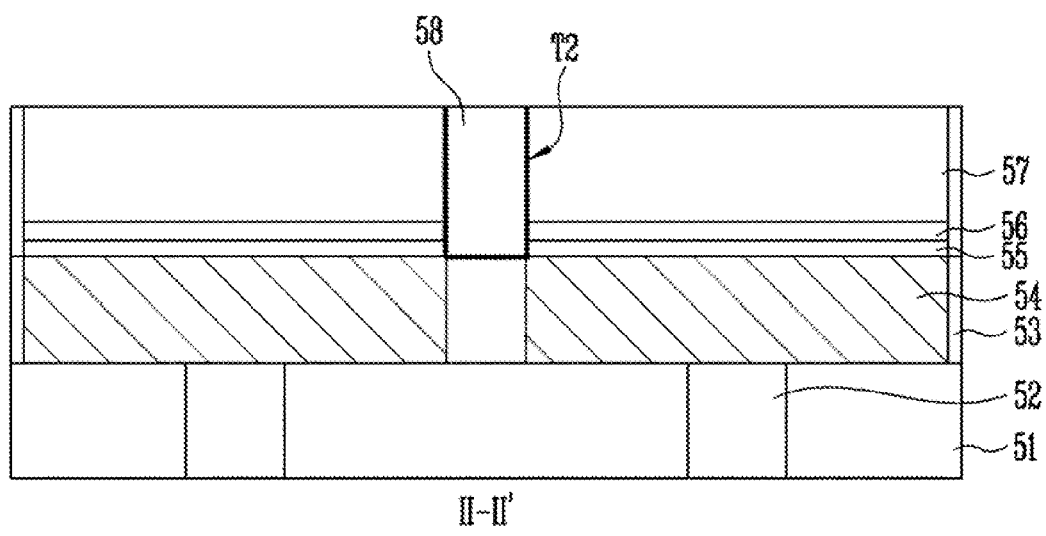

Referring to FIGS. 7A and 7B, after forming a second trench T2 that passes through the body structure 57, the well pickup layer 56, and the barrier layer 55, a third insulating layer 58 is formed in the second trench T2. The second trench T2 is for patterning the body structure 57, the well pickup layer 56, and the barrier layer 55. For example, when the plurality of source layers 54 are positioned under one stacked structure, the body structure 57, the well pickup layer 56, and the barrier layer 55 may be patterned in the same form as the source layers 54 by the second trench T2.

Figure 8A:
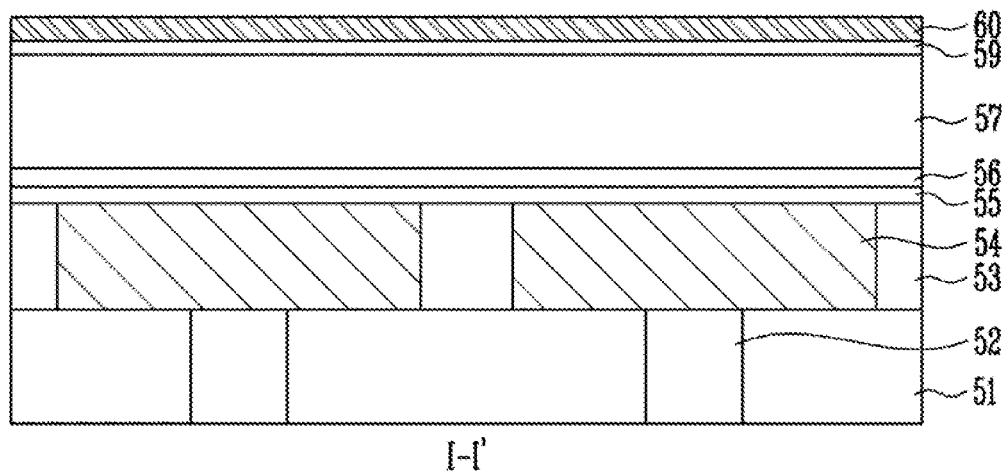
Figure 8B:
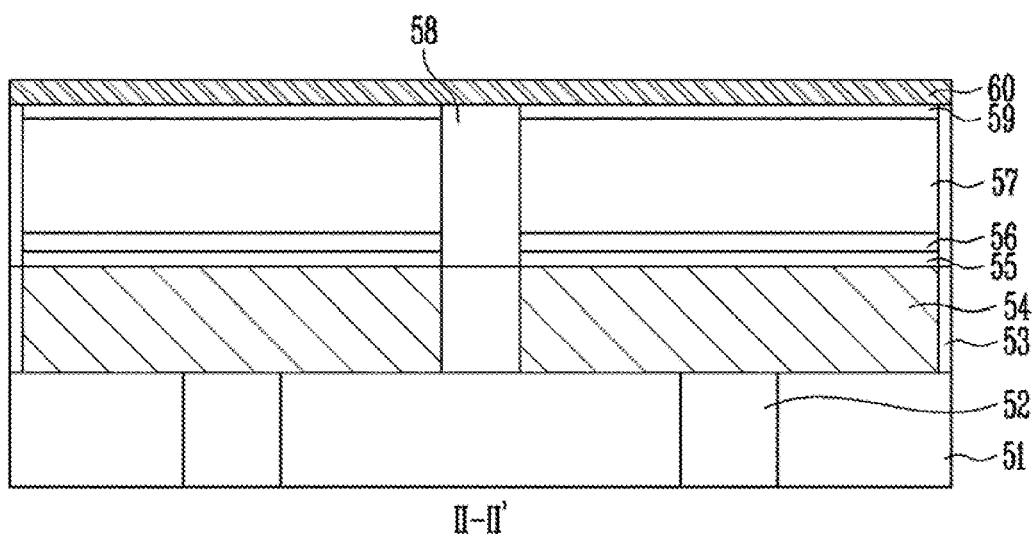

Referring to FIGS. 8A and 8B, a gate insulating layer 59 and a first material layer 60 are formed on a top surface of the body structure 57. For example, the gate insulating layer 59 may be formed by oxidizing the top surface of the body structure 57 to a partial thickness by an oxidizing process. The first material layer 60 is for forming the gate electrode of the source select transistor. For example, the first material layer 60 may be a sacrificial layer including a nitride or a conductive layer including polysilicon.

Figure 9A:
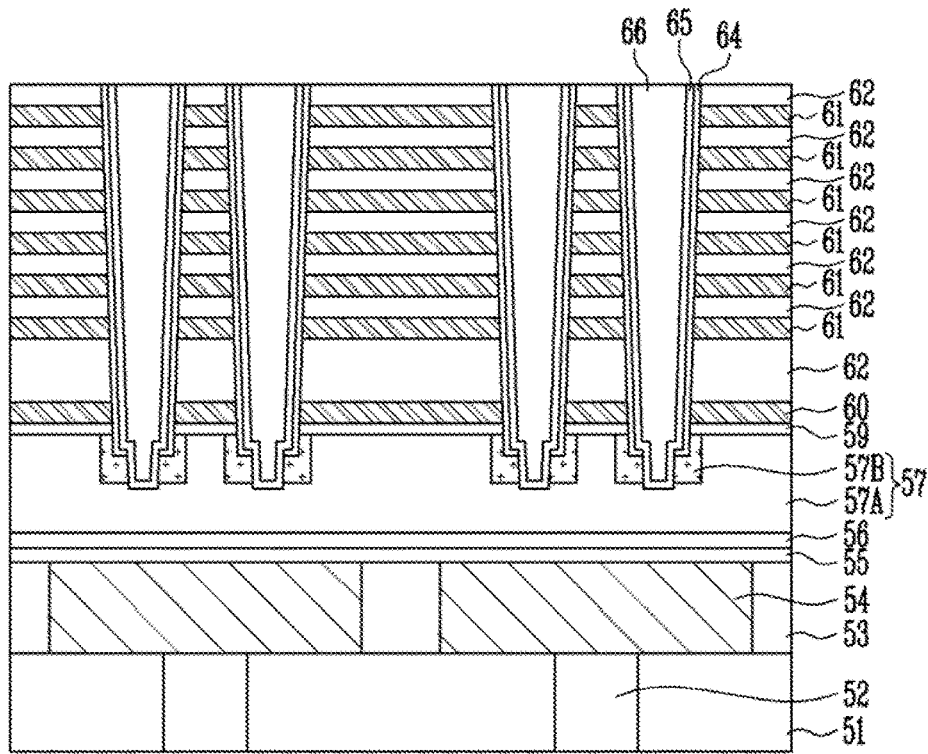
Figure 9B:
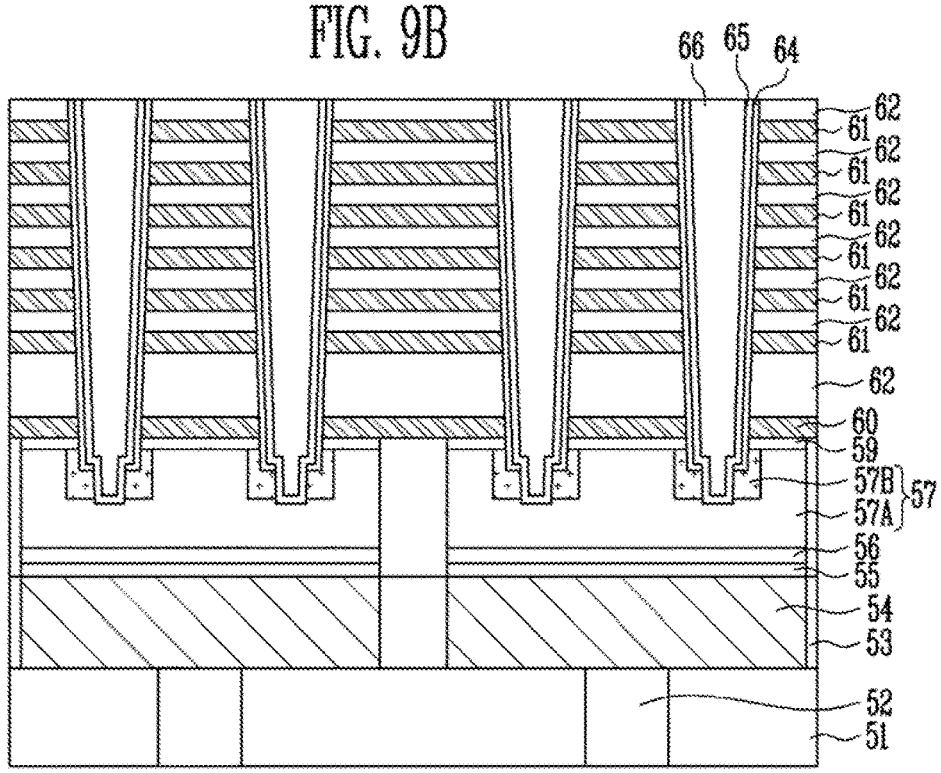

Referring to FIGS. 9A and 9B, second material layers 61 and third material layers 62 are alternately formed on the first material layer 60. The second material layers 61 for forming a memory cell or the gate electrode of the drain select transistor may be formed of the same material as the first material layer 60. The third material layers 62 are for forming an insulating layer for insulating stacked gate electrodes from each other. For example, the second material layers 61 may be sacrificial layers including a nitride, and the third material layers 62 may be insulating layers including an oxide. As another example, the second material layers 61 may be conductive layers including polysilicon, and the third material layers 62 may be insulating layers including an oxide. As yet another example, the second material layers 61 may be conductive layers including doped polysilicon, and the third material layers 62 may be sacrificial layers including undoped polysilicon. According to the current embodiment, it is illustrated that the first and second material layers 60 and 61 are sacrificial layers and the third material layers 62 are insulating layers.

Then, channel pillars 65 that pass through the first to third material layers 60 to 63 and the gate insulating layer 59; first junctions 57B positioned in a body structure 57 to contact the channel pillars 65; memory layers 64 that surround side walls of the channel pillars 65; and gap-fill insulating layers 66 filled in the channel pillars 65 are formed.

Figure 9C:
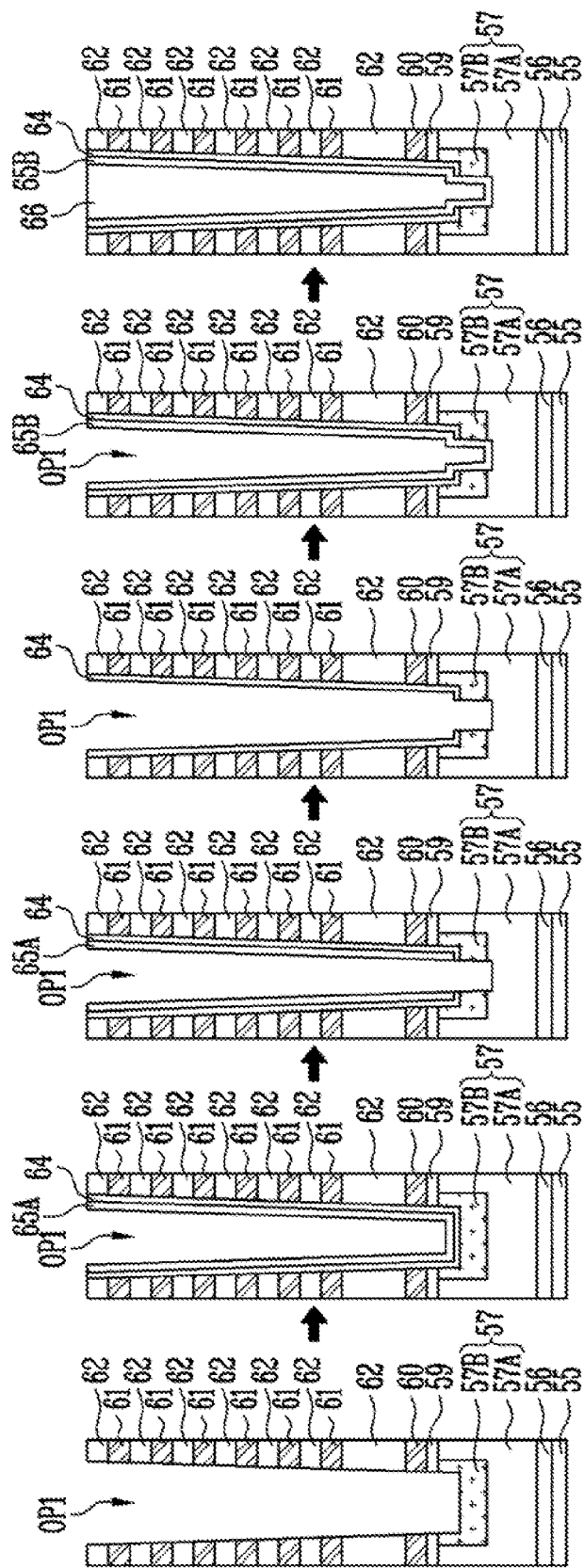

FIG. 9C is a cross-sectional view illustrating the various steps of manufacturing the first junctions 57B, the channel pillars 65, the memory layers 64, and the gap-fill insulating layers 66 according to an embodiment of the present invention, in which one enlarged channel pillar 65 is illustrated.

Referring to FIG. 9C, after forming a first opening OP1 that passes through the first to third material layers 60 to 62 and the gate insulating layer 59, the first junction 57B is formed in the body structure 57 exposed through the first opening OP1. For example, the first junction 57B is formed by doping n-type impurities of high concentration. Therefore, the body structure 57 includes the well region 57A and the first junction 57B. The well region 57A may be a remaining region of the body structure 57 in which the first junction 57B is not formed.

Then, the memory layer 64 and a first channel layer 65A may be formed in the first opening OP1. The memory layer 64 may include at least one of a charge blocking layer, a data storage layer, and a tunnel insulating layer; and the data storage layer may include silicon, a nitride, a phase change material, a ferroelectric material, or a nano dot. The first channel layer 65A may be a polysilicon layer. Then, the first junction 57B is exposed by removing the first channel layer 65A and the memory layer 64 formed on a bottom surface of the first opening OP1. For example, after etching the first channel layer 65A and the memory layer 64 by a front surface etching process, the first junction 57B and the well region 57A are exposed by partially etching the body structure 57. Then, after removing the first channel layer 65A, the second channel layer 65B that contacts the well region 57A and the first junction 57B is formed on the memory layer 64. For reference, the second channel layer 65B may be formed on the first channel layer 65A without removing the first channel layer 65A. Therefore, the channel pillar 65 may include the first and second channel layers 65A and 65B, or may include only the second channel layer 65B. The second channel layer 65B may be an undoped polysilicon layer. Then, the gap-fill insulating layer 66 is formed in the second channel layer 65B.

Figure 10A:
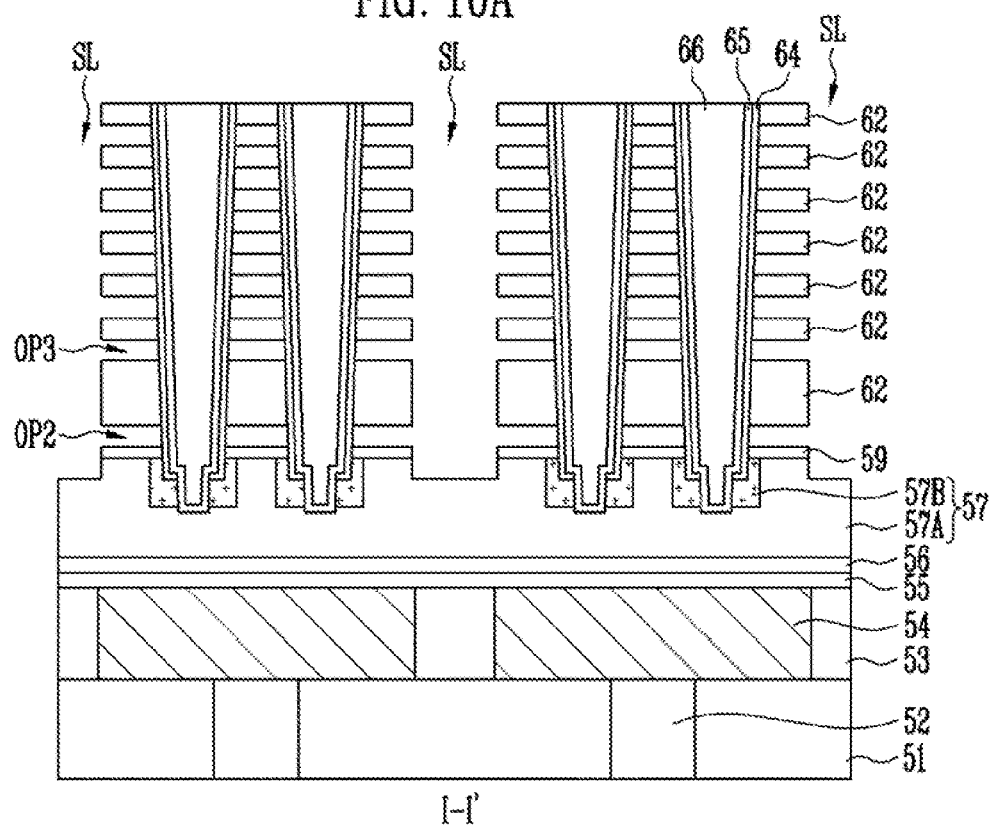
Figure 10B:
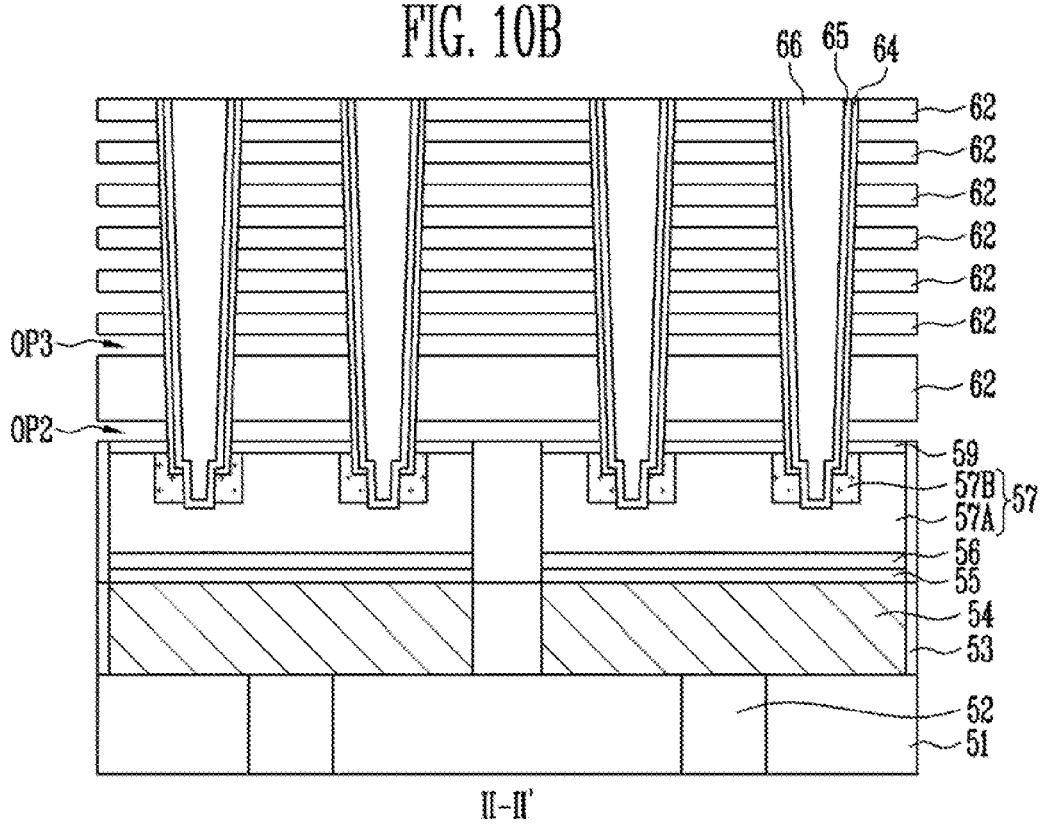

Referring to FIGS. 10A and 10B, slits SL that expose the body structure 57 through the first to third material layers 60 to 62 and the gate insulating layer 59 are formed. The second and third material layers 61 and 62 may be patterned to be a plurality of stacked structures by the slits SL.

Then, the first and second material layers 60 and 61 exposed through the slits SL are removed. Here, a second opening OP2 is formed in a region from which the first material layer 60 is removed, and third openings OP3 may be formed in regions from which the second material layers 61 are removed.

Figure 11A:
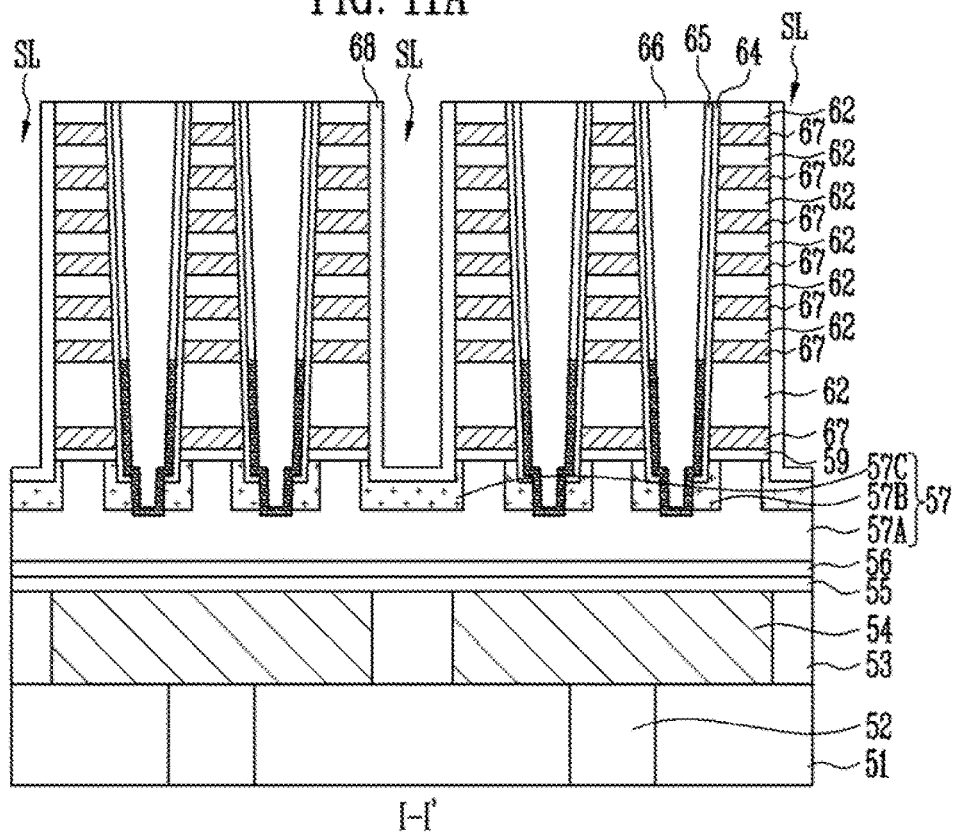
Figure 11B:
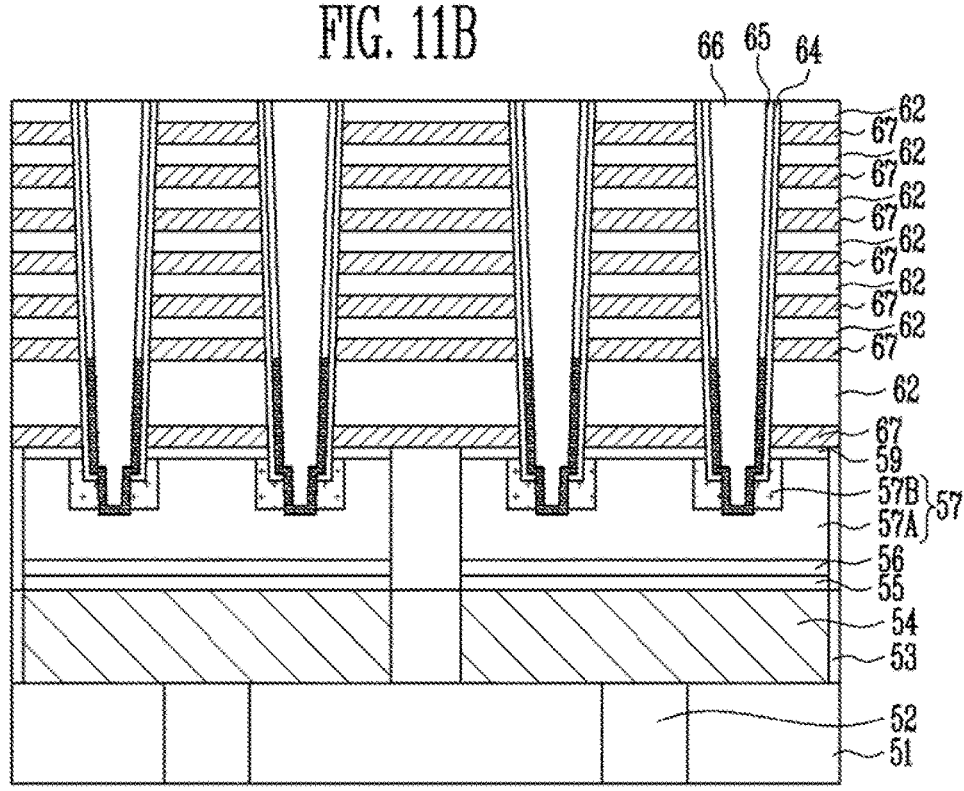

Referring to FIGS. 11A and 11B, conductive layers 67 are formed in the second and third openings OP2 and OP3. The conductive layer 67 formed in the second opening OP2 may be the gate electrode of the source select transistor or the source select line, and the conductive layers 67 formed in the third openings OP3 may be the gate electrodes of the memory cells, the word lines, the gate electrodes of the drain select transistors, or the drain select lines.

For reference, in a process of forming the conductive layers 67, impurities included in the first junctions 57B may be diffused into the well region 57A or the channel pillars 65.

Then, a second junction 57C is formed in the body structure 57 exposed through the slit SL. For example, the second junction 57C is formed by implanting impurities into the body structure 57 through the slit SL to a predetermined depth. The second junction 57C may include n-type impurities of high concentration. Then, a spacer insulating layer 68 is formed in the slit SL. The spacer insulating layer 68 functions as a protective layer for preventing the conductive layers 67 from being damaged in a subsequent process. For example, the spacer insulating layer 68 includes an oxide.

Figure 12A:
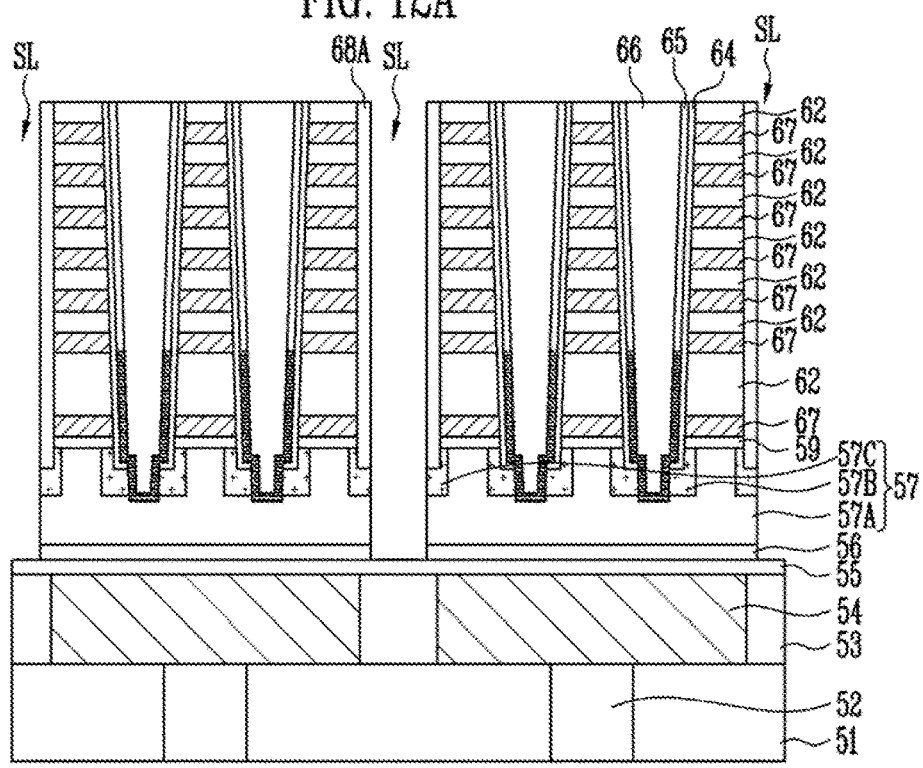
Figure 12B:
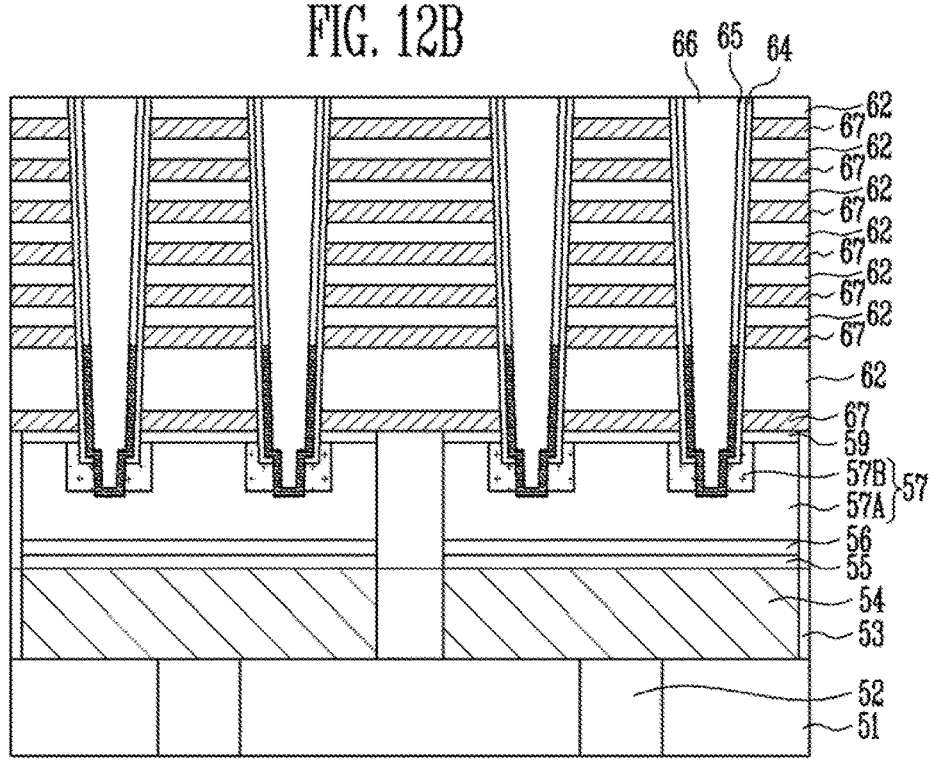

Referring to FIGS. 12A and 12B, after exposing the body structure 57 by etching the spacer insulating layer 68 formed on the bottom surface of the slit SL, the body structure 57 and the well pickup layer 56 are etched. Therefore, a spacer 68A is formed on an internal wall of the slit SL, and the slit SL extends to expose the barrier layer 55. In addition, the source layers 54 of adjacent stacked structures are separated from each other.

Figure 13A:
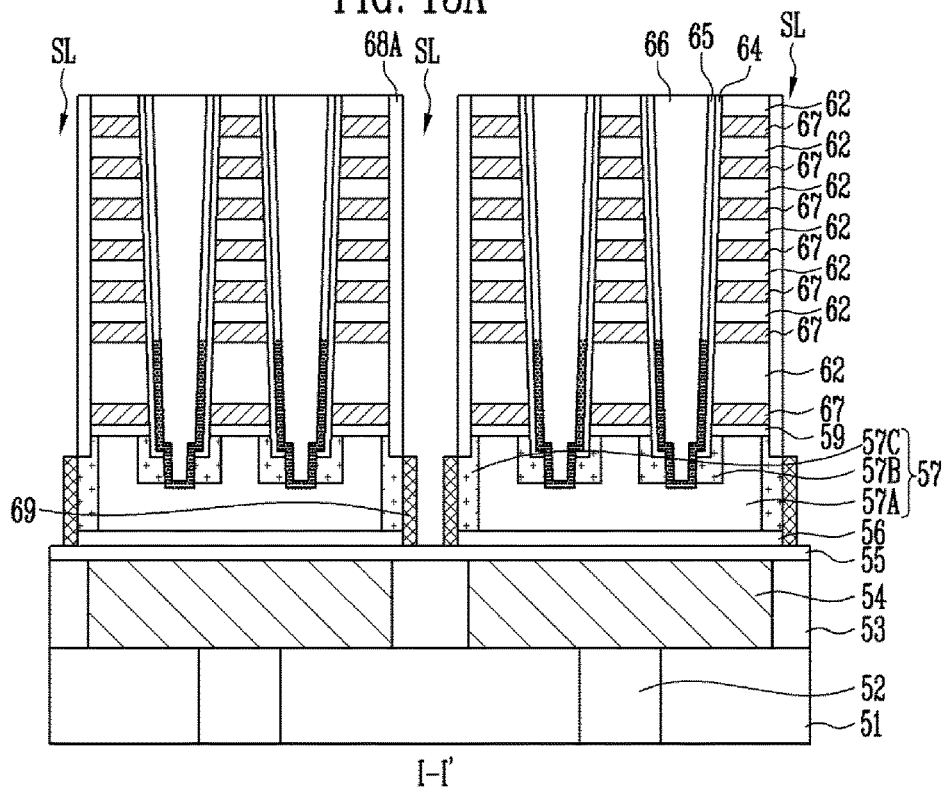
Figure 13B:
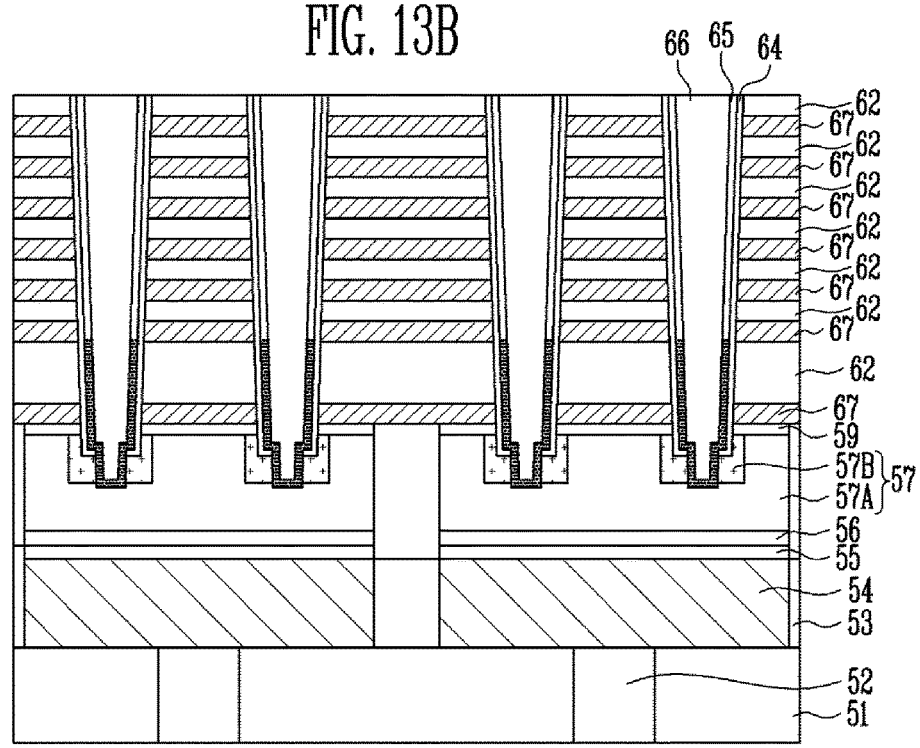

Referring to FIGS. 13A and 13B, a side wall of the body structure 57 exposed through the extended slit SL is doped with impurities so that the second junction 57C may extend along the slit SL. For example, the side wall of the body structure 57 is doped with n-type impurities by a plasma doping method. Therefore, the second junction 57C is formed on the side wall of the body structure 57, and the second junction 57C is connected to the well pickup layer 56.

Then, contact layers 69 are formed on side walls of the body structure 57. The contact layers 69 may include a silicide layer. For example, after forming a metal layer in the slit SL, reaction is made between the side wall of the body structure 57 and a metal layer (not shown) by a thermal processing process so that the contact layers 69 is formed of the silicide layer. Then, a residing non-reactive metal layer is removed. Therefore, the contact layers 69 may be selectively formed on the side walls of the body structure 57.

The contact layers 69 contact the second junction 47C and the well pickup layer 56. In addition, the well pickup layer 56 contacts the barrier layer 55 including metal, and the barrier layer 55 contacts the source layers 54 including metal. Therefore, the second junction 57C, the well pickup layer 56, and the source layers 54 are electrically connected through the contact layers 69.

Figure 14A:
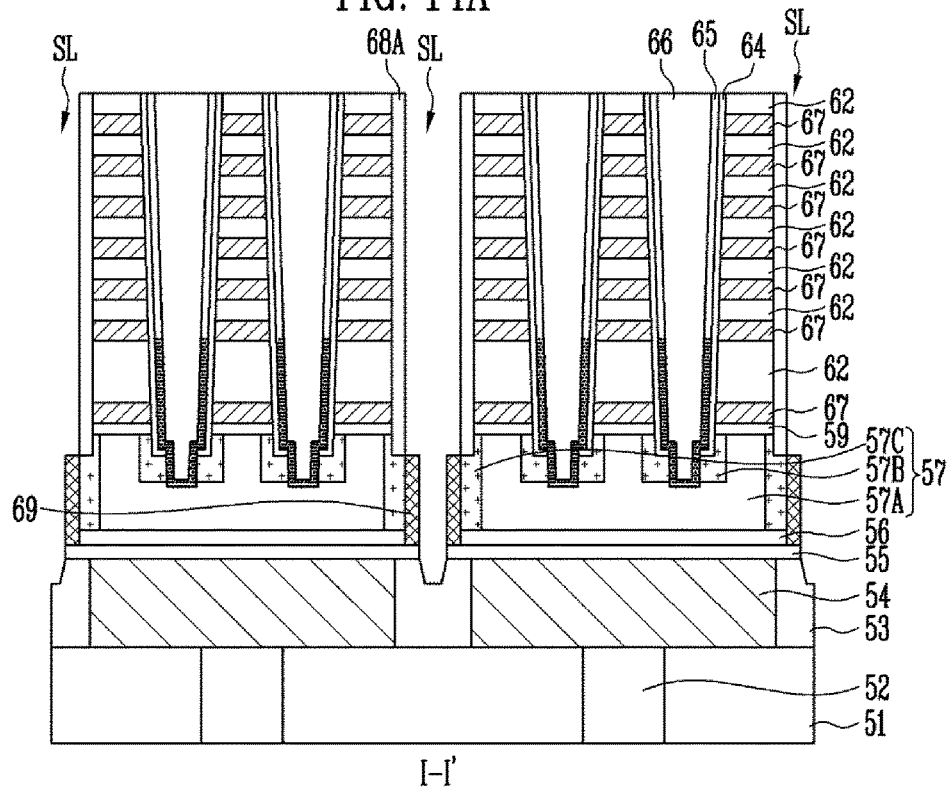
Figure 14B:
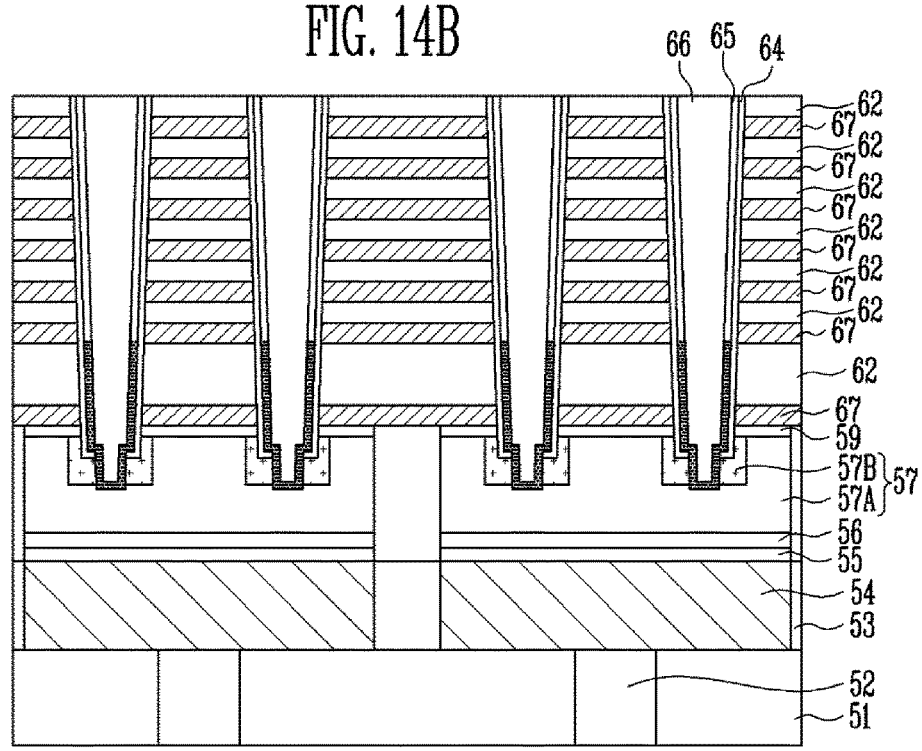

Referring to FIGS. 14A and 14B, the barrier layer 55 exposed to the bottom surface of the slit SL is etched. At this time, after etching the barrier layer 55, the second insulating layer 53 may be etched to a partial depth. Therefore, the slit SL extends to a lower part and the barrier layers 55 of adjacent stacked structures ST are separated from each other by the extended slit SL.

Figure 15A:
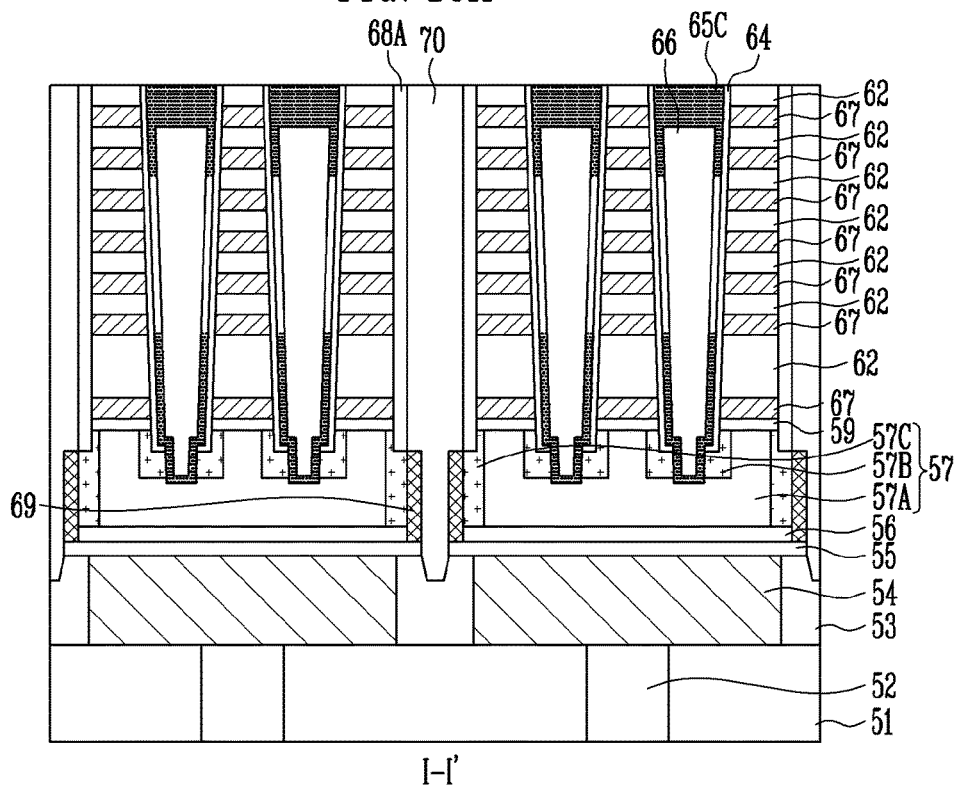
Figure 15B:
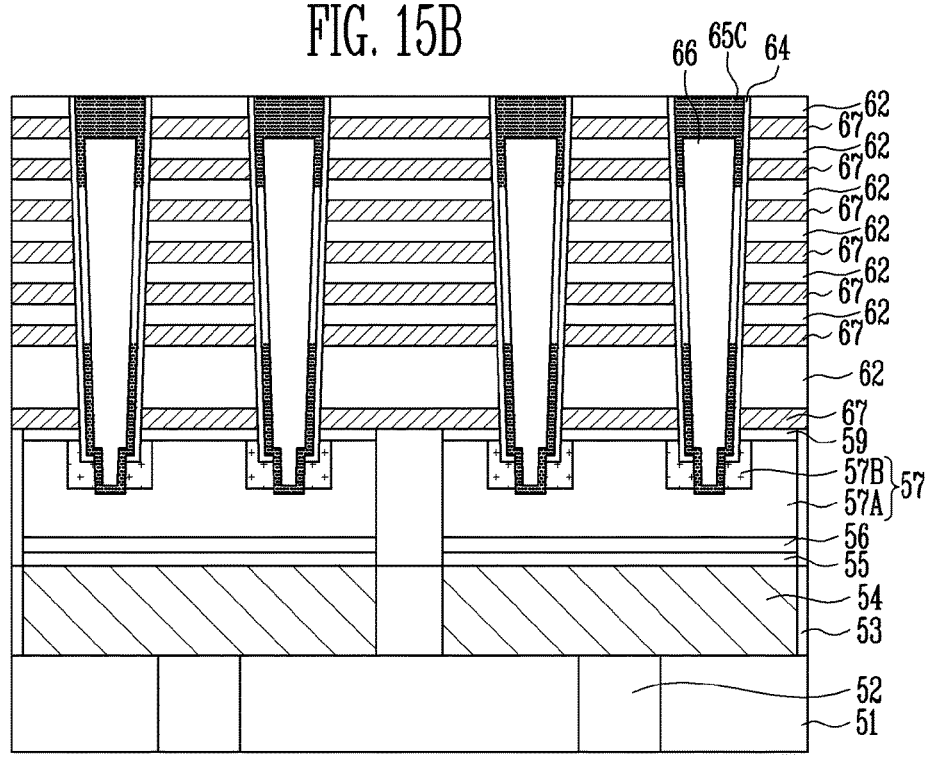

Referring to FIGS. 15A and 15B, a slit insulating layer 70 is formed in the slit SL. Then, after etching the gap-fill insulating layers 66 to a partial depth, plugs are formed in regions in which the gap-fill insulating layers 66 are etched. The plugs may be polysilicon layers doped with n-type impurities of high concentration. Then, laser is irradiated onto the plugs or a thermal processing process is performed on the plugs. Therefore, the impurities in the plugs are diffused into the channel pillars 65, and the plugs and upper parts of the channel pillars 65 that contact the plugs are melted and re-crystallized so that channel pillars 65C including junctions are formed in the upper parts of the channel pillars 65. The junctions may be formed to a depth so that the junctions overlap the conductive layer 67 for the gate electrode of the drain select transistor.

According to the above-described manufacturing method, the plurality of source layers 54 are formed under one stacked structure and the plurality of source layers 54 may be insulated from each other by the slit insulating layer 70. In addition, the body structure 57 and the well pickup layer 56 may be connected by a self-alignment method by forming the contact layer 69 on the side wall of the body structure 57.

On the other hand, the above-described manufacturing method may partially change in accordance with a material used for the first to third material layers 60 to 62. For example, when the first and second material layers 60 and 61 are conductive layers and the third material layers 62 are insulating layers, a process of forming the second and third openings and the conductive layers 67 is omitted. Instead, a process of siliciding the first and second material layers 60 and 61 exposed through the slits SL is additionally performed. As another example, when the second material layers 61 are conductive layers and the third material layers 62 are sacrificial layers, the process of forming the second and third openings and the conductive layers 67 is omitted. Instead, a process of replacing the third material layers 62 by the insulating layers through the slits SL is performed.

Figure 16:
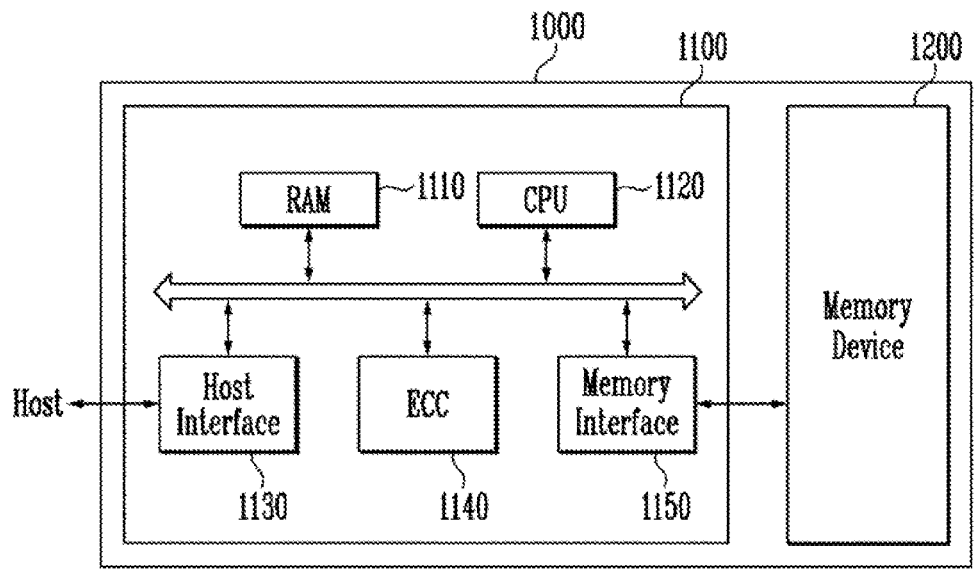
FIGS. 16 and 17 are block diagrams illustrating a configuration of a memory system, according to an embodiment of the present invention.

FIG. 16 is a block diagram illustrating a configuration of a memory system, according to an embodiment of the present invention.

Referring to FIG. 16, a memory system 1000 according to the embodiment of the present invention includes a memory device 1200 and a controller 1100.

The memory device 1200 is used for storing data information in the form of various data items such as text, graphic, and a software code. The memory device 1200 may be a non-volatile memory and may have a structure described with reference to FIGS. 1A to 15B. In addition, the memory device 1200 includes the source layer; the well pickup layer formed on the source layer; the body structure formed on the well pickup layer and including the well region contacting the well pickup layer and first junctions formed on the side walls of the body structure; the channel pillars contacting the body structure and protruding from the body structure; and the contact layers formed on the side walls of the body structure to electrically connect the body structure and the well pickup layer. Since the structure and manufacturing method of the memory device 1200 are the same as described above, detailed description thereof will not be given.

The controller 1100 is connected to a host and the memory device 1200 and accesses the memory device 1200 in response to request of the host. For example, the controller 1100 controls reading, writing, erasing, and background operations of the memory device 1200.

The controller 110 includes a random access memory (RAM) 1110, a central processing unit (CPU) 1120, a host interface 1130, an error correction code (ECC) circuit 1140, and a memory interface 1150, and an internal bus.

The RAM 1110 may be used as an operation memory of the CPU 1120, a cache memory between the memory device 1200 and the host, and a buffer memory between the memory device 1200 and the host. For reference, the RAM 1110 may be replaced by a static random access memory (SRAM), a read only memory (ROM), and the like.

The CPU 1120 controls an entire operation of the controller 1100. For example, the CPU 1120 may operate firmware, such as, a flash translation layer (FTL) stored in the RAM 1110.

The host interface 1130 performs interfacing with the host. The controller 1100 communicates with the host through at least one among various interface protocols, such as, for example, a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, and a private protocol.

The ECC circuit 1140 detects an error included in data read by the memory device 1200 by using an ECC and corrects the detected error. Any suitable ECC circuit may be employed.

The memory interface 1150 performs interfacing with the memory device 1200. For example, the memory interface 1150 may include a NAND interface or a NOR interface.

For reference, the controller 110 may further include a buffer memory (not shown) for temporarily storing data. The buffer memory temporarily stores data transmitted to the outside through the host interface 1130 or temporarily stores data transmitted from the memory device 1200 through the memory interface 1150. In addition, the controller 1100 may further include a ROM for storing code data for performing interfacing with the host.

As described above, since the memory system 1000 according to the embodiment of the present invention includes the memory device 1200 with improved erasing characteristic and integration degree, the characteristics and the integration degree of the memory system 1000 may also be improved.

Figure 17:
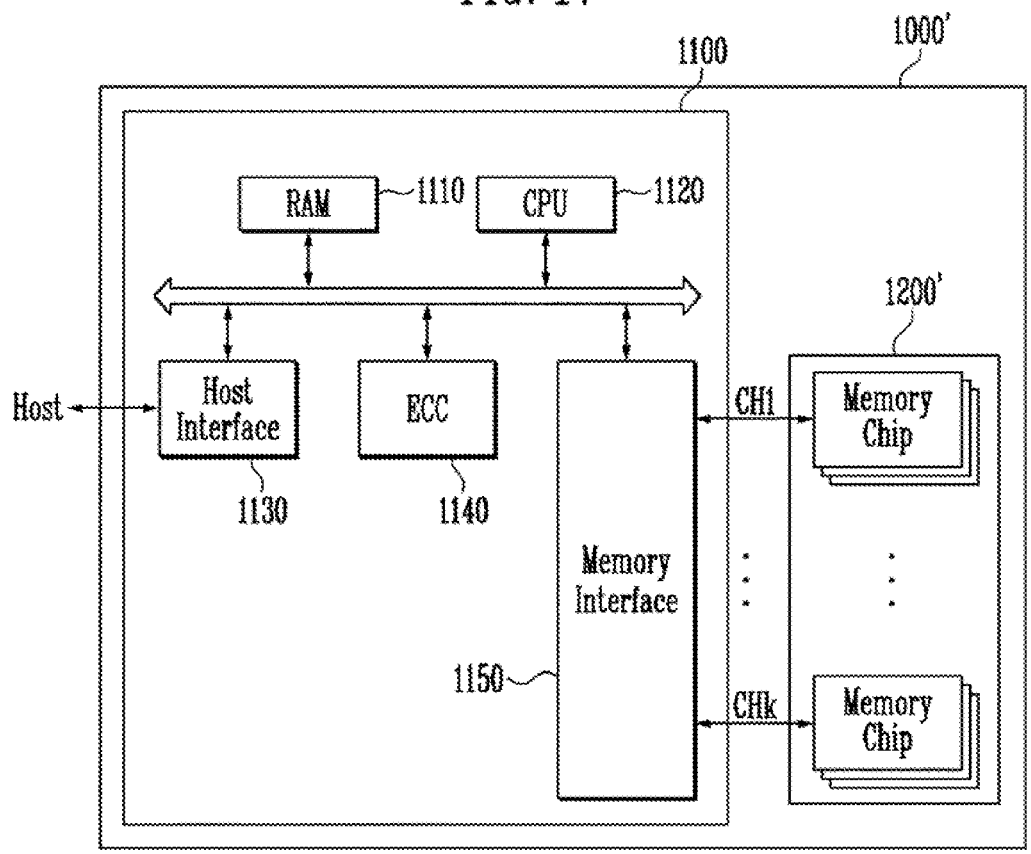

FIG. 17 is a block diagram illustrating a configuration of a memory system 1000' according to an embodiment of the present invention. Hereinafter, description of contents repeated to the above-described contents will not be given.

As illustrated in FIG. 17, the memory system 1000' according to the embodiment of the present invention includes a memory device 1200' and the controller 1100. In addition, the controller 1100 includes the RAM 1110, the CPU 1120, the host interface 1130, the ECC circuit 1140, and the memory interface 1150.

The memory device 1200' may be a non-volatile memory and may include a memory string as previously described with reference to FIGS. 1A to 15B. In addition, the memory device 1200' includes the source layer; the well pickup layer formed on the source layer; the body structure formed on the well pickup layer and including the well region contacting the well pickup layer and first junctions formed on the side walls of the body structure; the channel pillars contacting the body structure and protruding from the body structure; and the contact layers formed on the side walls of the body structure to electrically connect the body structure and the well pickup layer. Since the structure and manufacturing method of the memory device 1200' are the same as described above, detailed description thereof will not be given.

In addition, the memory device 1200' may be a multi-chip package formed of a plurality of memory chips. The plurality of memory chips are divided into a plurality of groups and the plurality of groups communicate with the controller 1100 through first to kth channels CH1 to CHk. In addition, the memory chips that belong to one group communicate with the controller 1100 through a common channel. For reference, the memory system 1000' may be transformed so that one memory chip is connected to one channel.

As described above, since the memory system 1000' according to the embodiment of the present invention includes the memory device 1200' with improved erasing characteristic and integration degree, characteristics and an integration degree of the memory system 1000' may be improved. In particular, it is possible to increase a data storage capacity and a driving speed of the memory system 1000' by forming the memory device 1200' of the multi-chip package.

Figure 18:
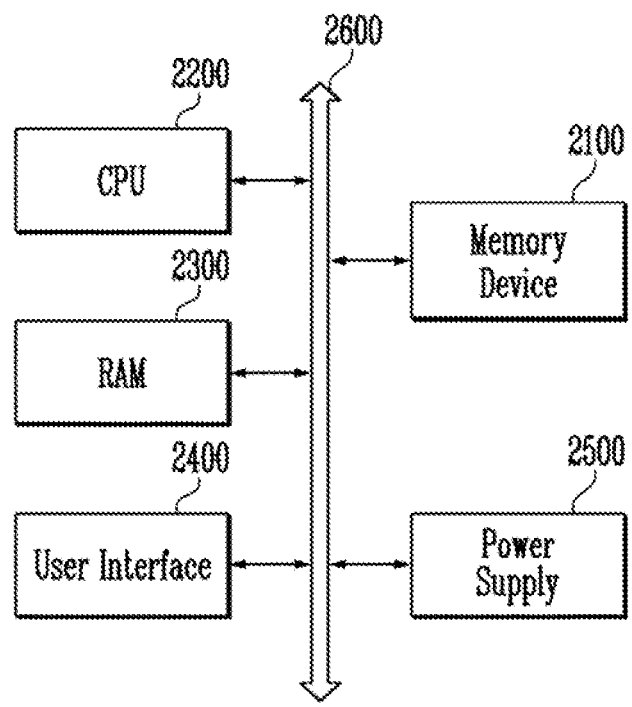
FIGS. 18 and 19 are block diagrams illustrating a configuration of a computing system, according to an embodiment of the present invention.

FIG. 18 is a block diagram illustrating a configuration of a computing system 2000 according to an embodiment of the present invention. Hereinafter, description of contents repeated to the above-described contents will not be given.

As illustrated in FIG. 18, the computing system 2000 according to the embodiment of the present invention includes a memory device 2100, a CPU 2200, a RAM 2300, a user interface 2400, a power source 2500, and a system bus 2600.

The memory device 2100 stores data provided through the user interface 2400 and data processed by the CPU 2200. In addition, the memory device 2100 is electrically connected to the CPU 2200, the RAM 2300, the user interface 2400, and the power source 2500 through the system bus 2600. For example, the memory device 2100 is connected to the system bus 2600 through a controller (not shown) or may be directly connected to the system bus 2600. When the memory device 2100 is directly connected to the system bus 2600, a function of the controller may be performed by the CPU 2200 and the RAM 2300.

The memory device 2100 may be a non-volatile memory and may include a memory string previously described with reference to FIGS. 1A to 15B. In addition, the memory device 2100 includes the source layer; the well pickup layer formed on the source layer; the body structure formed on the well pickup layer and including the well region contacting the well pickup layer and first junctions formed on the side walls of the body structure; the channel pillars contacting the body structure and protruding from the body structure; and the contact layers formed on the side walls of the body structure to electrically connect the body structure and the well pickup layer. Since the structure and manufacturing method of the memory device 2100 are the same as described above, detailed description thereof will not be given.

In addition, the memory device 2100 may be a multi-chip package formed of a plurality of memory chips as described with reference to FIG. 17.

The computing system 2000 having such a configuration may be a computer, an ultra-mobile PC (UMPC), a workstation, a net-book, a personal digital assistant, a portable computer, a web tablet, a wireless phone, a mobile phone, a smart phone, an e-book, a portable multimedia player (PMP), a portable gamer, a navigator, a black box, a digital camera, a three dimensional television, a digital audio recorder, a digital audio player, a digital picture recorder, a digital picture player, a digital video recorder, a digital video player, a device capable of transmitting and receiving information in a wireless environment, one of various electronic devices that form a home network, one of various electronic devices that form a computer network, one of various electronic devices that form a telematics network, and an RFID device.

As described above, since the computing system 2000 according to the embodiment of the present invention includes the memory device 2100 with improved erasing characteristic and integration degree, characteristics and a data storage capacity of the computing system 2000 may be improved.

Figure 19:
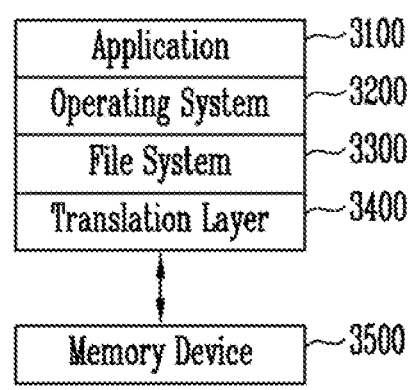

FIG. 19 is a block diagram illustrating a computing system 3000, according to an embodiment of the present invention.

As illustrated in FIG. 19, the computing system 3000 includes a software layer including an operating system 3200, an application 3100, a file system 3300, and a translation layer 3400. In addition, the computing system 3000 includes a hardware layer such as a memory device 3500.

The operating system 3200 for managing software and hardware resources of the computing system 3000 may control program execution of the CPU. The application 3100 may be a utility executed by the operating system 3200 by various application programs performed by the computing system 3200.

The file system 3300 may be or include a logical structure for managing data and files that exist in the computing system 3000 and organizes files or data to be stored in the memory device 3500 in accordance with regulations. The file system 3300 may be determined in accordance with the operation system 3200 used by the computing system 3000. For example, the operating system 3200 is Windows of Microsoft, the file system 3300 may be a file allocation table (FAT) and an NT file system (NTFS). In addition, the operating system 3200 is unix/linux, the file system 3300 may be an extended file system (EXT), a unix file system (UFS), and a journaling file system (JFS).

In the drawing, the operating system 3200, the application 3100, and the file system 3300 are illustrated as an additional block. However, the application 3100 and the file system 3300 may be included in the operating system 3200.

The translation layer 3400 translates an address to be suitable for the memory device 3500 in response to request of the file system 3300. For example, the translation layer 3400 translates a logic address generated by the file system 3300 into a physical address of the memory device 3500. Here, mapping information of the logic address and the physical address may be stored as an address translation table. For example, the translation layer 3400 may be a flash translation layer (FTL) and a universal flash storage link layer (ULL).

The memory device 3500 may be a non-volatile memory and may include a memory string as previously described with reference to FIGS. 1A to 15B. In addition, the memory device 3500 includes the source layer; the well pickup layer formed on the source layer; the body structure formed on the well pickup layer and including the well region contacting the well pickup layer and first junctions formed on the side walls of the body structure; the channel pillars contacting the body structure and protruding from the body structure; and the contact layers formed on the side walls of the body structure to electrically connect the body structure and the well pickup layer. Since the structure and manufacturing method of the memory device 3500 are the same as described above, detailed description thereof will not be given.

The computing system 3000 having such a structure may be divided into an operating system layer executed in an upper level region and a controller layer executed in a lower level region. The application 3100, the operating system 3200, and the file system 3300 are included in the operating system layer and may be driven by an operation memory of the computing system 2000. In addition, the translation layer 3400 may be included in the operating system layer or the controller layer.

As described above, since the computing system 3000 according to the embodiment of the present invention includes the memory device 3500 with improved erasing characteristic and integration degree, the characteristics and the data storage capacity of the computing system 3000 may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a source layer;
   a well pickup layer formed on the source layer and electrically coupled to the source layer;
   a body structure formed on the well pickup layer, and including a well region contacting the well pickup layer and first junctions including impurities and formed on side walls of the body structure;
   channel pillars contacting the body structure and protruding from the body structure; and
   contact layers formed on the side walls of the body structure, and electrically connecting the body structure and the well pickup layer.

2. The semiconductor device of claim 1, further comprising a source select transistor including a gate insulating layer formed on a top surface of the body structure, and a gate electrode formed on the gate insulating layer.

3. The semiconductor device of claim 2,
   wherein the first junction is a source region of the source select transistor, and
   wherein, when the source select transistor is turned on, a channel is formed in the body structure among the first junctions.

4. The semiconductor device of claim 3, wherein, when the source select transistor is turned on, currents flow from the channel pillars to the source layer through the channel, the first junctions, and the contact layers.

5. The semiconductor device of claim 1, wherein, during an erase operation, electronic holes are supplied from the source layer to the channel pillars through the well pickup layer and the body structure.

6. The semiconductor device of claim 1, further comprising memory cells stacked along the channel pillars.

7. The semiconductor device of claim 6,
wherein each of the memory cells comprises gate electrodes that surround side walls of the channel pillars, and memory layers interposed between the channel pillars and the gate electrodes, and
wherein, when the memory cells are turned on, channels are formed in the channel pillars.

8. The semiconductor device of claim 1, further comprising a barrier layer interposed between the well pickup layer and the source layer, and electrically connected to the well pickup layer, the contact layers, and the source layer.

9. The semiconductor device of claim 1, further comprising second junctions formed in the body structure, and contacting the channel pillars.

10. The semiconductor device of claim 1, wherein the source layer comprises metal.

11. The semiconductor device of claim 1,
wherein the well pickup layer comprises p-type impurities of a first concentration, and
wherein the well region comprises p-type impurities of a second concentration lower than the first concentration.

12. The semiconductor device of claim 11, wherein the first junction comprises n-type impurities.

13. The semiconductor device of claim 1,
wherein the well pickup layer is a polysilicon layer including p-type impurities, and
wherein the body structure is an undoped polysilicon layer.

14. The semiconductor device of claim 1, further comprising a peripheral circuit positioned under the source layer, and connected to the source layer.

15. A semiconductor device comprising:
a source layer;
a well pickup layer formed on the source layer;
a body structure formed on the well pickup layer, and including a well region contacting the well pickup layer and first junctions formed on side walls of the body structure;
a stacked structure formed on the body structure;
channel pillars passing through the stacked structure, and contacting the body structure; and
contact layers formed on the side walls of the body structure, and electrically connecting the first junctions and the well pickup layer.

16. The semiconductor device of claim 15, further comprising:
an insulating layer formed on a top surface of the body structure; and
a source select line formed on the insulating layer.

17. The semiconductor device of claim 15, wherein the stacked structure comprises:
stacked word lines surrounding side walls of the channel pillars; and
memory layers interposed between the channel pillars and the word lines.

18. The semiconductor device of claim 15, wherein the source layer is positioned under the stacked structure.

19. The semiconductor device of claim 15,
wherein the semiconductor device includes the source layer in the plural, and
wherein the plurality of source layers are positioned under the stacked structure.

20. The semiconductor device of claim 19, wherein adjacent stacked structures share the plurality of source layers.

* * * * *